US007577557B2

(12) United States Patent
Kondo et al.

(10) Patent No.: US 7,577,557 B2
(45) Date of Patent: Aug. 18, 2009

(54) SIMULATOR AND SIMULATION METHOD FOR BEHAVIORS OF PROCESSORS

(75) Inventors: Takahiro Kondo, Fukuoka (JP);
Tsuyoshi Nakamura, Kasuya-Gun (JP);
Maiko Taruki, Kitakyushu (JP);
Tomonori Yonezawa, Fukuoka (JP)

(73) Assignee: Panasonic Corporation, Osaka (JP)

( * ) Notice: Subject to any disclaimer, the term of this patent is extended or adjusted under 35 U.S.C. 154(b) by 505 days.

(21) Appl. No.: 10/969,027

(22) Filed: Oct. 21, 2004

(65) Prior Publication Data
US 2005/0091028 A1    Apr. 28, 2005

(30) Foreign Application Priority Data
Oct. 22, 2003    (JP)    ............... 2003-361914

(51) Int. Cl.
*G06F 17/50* (2006.01)
*G06F 9/44* (2006.01)

(52) U.S. Cl. .......................................... 703/14; 703/21
(58) Field of Classification Search .................... 703/14, 703/16, 17, 21; 717/128, 135
See application file for complete search history.

(56) References Cited

U.S. PATENT DOCUMENTS

| 5,544,067 A | 8/1996 | Rostoker et al. |
| 5,805,867 A * | 9/1998 | Kodaira ........................ 703/21 |
| 6,240,544 B1 | 5/2001 | Kaneko |
| 2001/0041972 A1 | 11/2001 | Dearth et al. |
| 2002/0040288 A1 | 4/2002 | Yamoto et al. |
| 2003/0110477 A1 | 6/2003 | Wakabayashi et al. |

FOREIGN PATENT DOCUMENTS

| CN | 1081008 | 1/1994 |
| JP | 5-233317 | 9/1993 |

OTHER PUBLICATIONS

Beling, S. et al. "An In-Circuit Signal Analyzer for Mixed Signal Digital Signal Processor." 1991 Int'l Conf. on Acoustics, Speech, and Signal Processing (ICASSP-91). Apr. 14-17, 1991. vol. 2. pp. 1109-1112.*

* cited by examiner

*Primary Examiner*—Paul L Rodriguez
*Assistant Examiner*—Eunhee Kim
(74) *Attorney, Agent, or Firm*—Wenderoth, Lind & Ponack, L.L.P.

(57) ABSTRACT

A simulator operable to simulate behaviors of a processor using software is provided. The simulator includes a command input unit, a memory element, a register element, a control element, a resource information storage unit, and a resource access-analyzing unit. The command input unit is operable to analyze/process entered commands. The memory element is operable to store executive instructions issued by the processor and data treated by the processor. The register element is operable to contain data for use in calculation. The control element is operable to access the memory element and register element in accordance with the executive instructions. The resource information storage unit is operable to contain specified resource information and a piece of read/write information for each piece of the resource information. The resource access-analyzing unit is operable to compare access destinations (the memory element and register element to be accessed by the control element) and a read/write classification with the resource information and read/write information contained in the resource information storage unit, thereby practicing a resource access analysis as to whether or not the access destinations are allowed by the resource information and read/write information.

22 Claims, 32 Drawing Sheets

Fig. 2

```
『LOAD-command』
[form] LOAD <file>
[function] load executive instruction from file <file>
[example] LOAD  program. lst 『Go-command』
[form] GO
[function] execute program
[example] GO 『ALLOC-command』
[form 1] ALLOC MEM  <SA>  <EA>  <SPC>  <EPC>  <RW>
  [function] set up resource information (SA, EA), PC-information (SPC,EPC), Read/Write
information (RW)
       <SA>    memory region range for access (start address) (hexadecimal)
       <EA>    memory region range for access (end address) (hexadecimal)
       <SPC>   executive instruction address range (start address) (hexadecimal)
       <EPC>   executive instruction address range (end address) (hexadecimal)
       <RW>    R: only read-out is permitted
               W: only write-in is permitted
               RW: read-out and write-in are permitted
[example] ALLOC MEM 100 1FF 0 F R
[form 2] ALLOC REG  <REGNAME>  <SPC>  <EPC>  <RW>
  [function] set up register classification (REGNAME), PC-information (SPC, EPC), Read/Write
information (RW)
       <REGNAME>  register name for access
       <SPC>   executive instruction address range (start address) (hexadecimal)
       <EPC>   executive instruction address range (end address) (hexadecimal)
       <RW>    right-of-access
               R: only read-out is permitted
               W: only write-in is permitted
               RW: read-out and write-in are permitted
[example] ALLOC REG REG0 0 F RW 『LOADALLOC-command』
[form] LOADALLOC  <file>
[function]  load resource information (SA, EA), PC-information (SPC, EPC), and Read/Erite
information from file <file> and set up
[example] LOADALLOC  program. alc 『QUIT-command』
[form] QUIT
[function] stop simulator
[example] QUIT
```

200

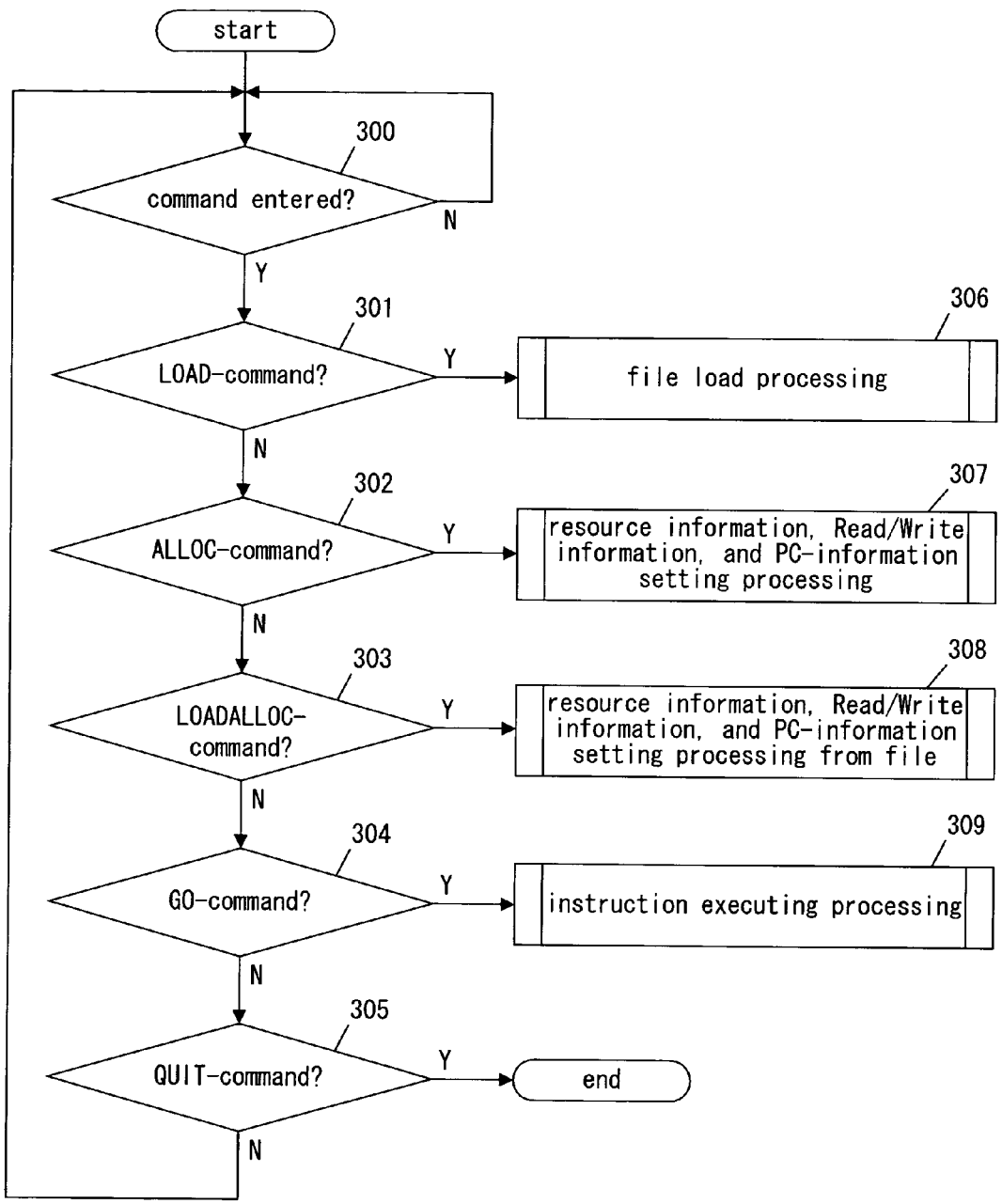

Fig. 15

```
『LOAD-command』
[form] LOAD <file>
[function] load executive instruction from file <file>
[example] LOAD program. 1st 『GO-command』
[form] GO
[function] execute program
[example] GO 『ALLOCD-command』
[form 1] ALLOCD MEM  <SA> <EA> <SPC> <EPC> <MIN> <MAX>
 [function]  set up resource information (SA, EA), PC-information (SPC, EPC), data information
(MIN, MAX)
       <SA>    memory region range for access (start address) (hexadecimal)
       <EA>    memory region range for access (end address) (hexadecimal)
       <SPC>   executive instruction address range (start address) (hexadecimal)
       <EPC>   executive instruction address range (end address) (hexadecimal)
       <MIN>   data range (minimum value) (hexadecimal)
       <MAX>   data range (maximum value) (hexadecimal)
[example] ALLOCD MEM 100 1FF  0  F  0  FF
[form 2] ALLOCD REG  <REGNAME> <SPC> <EPC>  <MIN>  <MAX>
 [function]  set up register classification (REGNAME), PC-information (SPC, EPC), data
information (MIN, MAX)
       <REGNAME>  register name for access
       <SPC> executive instruction address range (start address) (hexadecimal)
       <EPC> executive instruction address range (end address) (hexadecimal)
       <MIN> data range (minimum value) (hexadecimal)
       <MAX> data range (maximum value) (hexadecimal)
[example] ALLOCD REG REG0 0 F 1 1

『LOADALLOCD-command』
[form] LOADALLOCD <file>
[function] load resource information (SA, EA), PC-information (SPC, EPC), Read/Write information
(RW) from file <file>, and set up
[example] LOADALIOCD program. alc 『QUIT-command』
[form] QUIT
[function] end simulator
[example] QUIT
```

```
『LOAD-command』
[form] LOAD <file>
[function] load executive instruction from file <file>
[example] LOAD program. 1st 『GO-command』
[form] GO
[function] execute program
[example] GO 『SET-command』
[form 1] SET MEM <ADDR> <DATA>
  [function] set data <DATA> to address <ADDR> of memory domain
       <ADDR> memory region address for setting up data (hexadecimal)
       <DATA> data to be set to designated memory region (hexadecimal)

[example] SET MEM 100 F
[form 2] SET REG <REGNAME> <DATA>
  [function] set data <DATA> to register <REGNAME>
       <REGNAME> register name for setting up data
       <DATA>  data to be set to designated memory region (hexadecimal)
[example] SET REG REG0 0

『QUIT-command』
[form] QUIT
[function] end simulator
[example] QUIT
```

SIMULATOR AND SIMULATION METHOD FOR BEHAVIORS OF PROCESSORS

BACKGROUND OF THE INVENTION

1. Field of the Invention

The present invention relates to a simulator operable to simulate, using software, behaviors of processors such as a DSP (Digital Signal Processor), and an art related thereto.

2. Description of the Related Art

The development of built-in software entails steps as discussed below. At an initial step, source codes are described in high-level language such as C/C++. In the source codes, descriptions that value performance (e.g., an amount to be processed, and an amount of resource consumption) are coded in assembler language.

At the next step, the coded software is executed on a simulator to debug the source codes. The simulator simulates target resources (a register and a memory) such as a DSP, and their behaviors.

The simulator is used during the debugging of the source codes. The simulator is run on a host processor such a personal computer (PC) and a work station (WS). The simulator is operable to stop the software in execution from running in timed sequence, to reference the various resources (the register and the memory) to see how they are, and to set a value to each of the various resources.

Patent Reference No. 1 (published Japanese Patent Application Laid-Open No. (HEI) 5-233317) discloses a simulator operable to display a name of a function after the execution of the software, in which the function has written data to a memory specified in advance by commands.

The following discusses the software simulator as taught by Patent Reference No. 1.

FIG. 33(a) is a flowchart illustrating the software simulator of Patent Reference No. 1. FIG. 33(b) is a region access table prepared by the above software simulator.

In FIG. 33(a), at step 3300, a command is entered. At step 3301, the command is analyzed.

When the analysis shows that the entered command is a region access command, then the region access command is processed at step 3303.

When it is determined at step 3303 that the entered command is a setacc-command, then the region access table 3308 as illustrated in FIG. 33(b) is drawn up in accordance with command-specified address information.

When it is determined at step 3303 that the entered command is a getacc-command, not the setacc-command, then the name of a function consistent with the command-specified address information is displayed in the region access table 3308.

At step 3304, a determination is made as to whether or not the entered command is an instruction-executing command. When the determination in step 3304 answers "NO", then the routine is returned to step 3300.

When the answer to the determination in step 3304 is "YES", then single instructions are executed at step 3305. At step 3306, a determination is made as to whether or not data has been written to a region specified by the setacc-command.

It is determined at step 3306 whether or not the instructions executed at the previous step are memory access instructions. When the determination in step 3306 answers "NO", then the routine is terminated.

When it is determined at step 3306 that the executed instructions are the memory access instruction, and further when address information contained in the region access table 3308 includes a write destination to which the data was written, then the name of the function including the executive instructions is placed into the region access table 3308.

At step 3307, a determination is made as to whether or not the execution of the instructions is completed. When the determination in step 3307 answers "NO" and therefore the execution of the instructions must be continued, then the routine is advanced to step 3305. When the answer to the determination in step 3307 is "YES", then the routine is returned to step 3300.

In this way, the simulator as disclosed by Patent Reference No. 1 is designed to display the name of the function after the execution of the software, in which the function has written data to the memory specified by commands in advance.

The prior art simulators are, however, incapable of checking up on the occurrence of access (read and write) to the resources (the register and memory) beyond the range intended by software developers, and of checking data obtained during the access (read and write) to the resources (the register and memory) to determine whether or not the data has a value intended by the software developers. When unintended access or data drives the software to malfunction, then the software developers must repeat the steps of executing the software, stopping the software, and referencing the resources to see how the resources are, in order to pinpoint problems in the software. As a result, software development is performed with considerably reduced efficiency.

The prior art simulators are operable to check, for each of the executive instructions during simulation, whether or not certain instructions have been executed, and to record such a history. However, the prior art simulators have another problem with conditioned instructions that force the executive instructions to change a course of action in dependence upon a register value. For example, the conditioned instructions branch off each step to a specified address when the register has the value of "0". More specifically, the prior art simulators are incapable of checking conditions under which the conditioned instructions have been executed. As a result, there is no way to ascertain whether or not the developed software is run in all respects in accordance with the intent of the software developers.

The software simulator as disclosed in Patent Reference No. 1 is capable of checking up on neither access to the register nor read from the memory. For writing data to the memory, the software simulator is merely able to display histories on the function name after the execution of the software, but is not able to pinpoint problems in the write.

OBJECTS AND SUMMARY OF THE INVENTION

A first object of the present invention is to provide a simulator that allows for software development with improved efficiency. A second object of the present invention is to provide a simulator that leads to the development of software completed with improved perfection.

A first aspect of the present invention provides a simulator operable to represent elements including a processor, using a plurality of simulated elements, and to simulate behaviors of the processor. The plurality of simulated elements includes: a memory element representing a memory operable to store executive instructions issued by the processor and data treated by the processor; a register element representing a register in the processor; and a control element representing a controller operable to access the memory element and/or the register element. The simulator includes: a command input unit operable to analyze an entered command and to operate the plurality of simulated elements; and a unit operable to check up on resource access in which the control element provides access to the memory element and/or the register element.

A second aspect of the present invention provides a simulator as defined in the first aspect of the present invention, in which the unit operable to check up on the resource access includes a resource information storage unit operable to store resource information and a resource access-analyzing unit operable to analyze, with reference to the resource information, whether or not the resource access is proper. The resource information includes a memory region range in the memory element, a read/write classification in the memory element, a register classification in the register element, and a read/write classification in the register element.

A third aspect of the present invention provides a simulator as defined in the first aspect of the present invention, in which the resource information is specified by the command.

A fourth aspect of the present invention provides a simulator as defined in the first aspect of the present invention, in which the resource information is provided as data specified by the command.

A fifth aspect of the present invention provides a simulator as defined in the second aspect of the present invention, in which the resource information storage unit is operable to store address range information on the executive instructions from the processor, and which the resource access-analyzing unit is operable to analyze, with reference the address range information on the executive instructions from the processor, whether or not the executive instructions are proper.

The above constructions allow allocation information to be specified in advance to execute instructions. The allocation information includes executive instruction address ranges, resources to which access is permitted to provide, and access classifications (read and write). This feature makes it feasible to detect processing that violates the specified allocation information, and to notify software developers of the detection. As a result, when software problems bring about unintended access to the resources, then the problems can be pinpointed with ease, and consequently software development with improved efficiency is realized.

A sixth aspect of the present invention provides a simulator operable to represent elements including a processor, using a plurality of simulated elements, and to simulate behaviors of the processor. The plurality of simulated elements includes: a memory element representing a memory operable to store executive instructions issued by the processor and data treated by the processor; a register element representing a register in the processor; and a control element representing a controller operable to access the memory element and/or the register element. The simulator includes: a command input unit operable to analyze an entered command and to operate the plurality of simulated elements; and a unit operable to check up on data access in which the control element provides access to the memory element and/or the register element.

A seventh aspect of the present invention provides a simulator as defined in the sixth aspect of the invention, in which the unit operable to check up on the data access includes a data information storage unit operable to store data information and a data access-analyzing unit operable to analyze, with reference to the data information, whether or not the data access is proper. The data information includes a memory region range in the memory element, a read/write classification in the memory element, a register classification in the register element, and a read/write classification in the register element.

An eighth aspect of the present invention provides a simulator as defined in the sixth aspect of the invention, in which the data information is specified by the command.

A ninth aspect of the present invention provides a simulator as defined in the sixth aspect of the invention, in which the data information is provided as data specified by the command.

A tenth aspect of the present invention provides a simulator as defined in the seventh aspect of the invention, in which the data information storage unit is operable to store address range information on the executive instructions from the processor, and which the data access-analyzing unit is operable to analyze, with reference to the address range information on the executive instructions from the processor, whether or not the executive instructions are proper.

The above constructions allow allocation information to be specified in advance to execute instructions. The allocation information includes executive instruction address ranges, resources to which access is permitted to provide, and data ranges (minimum and maximum values). This feature makes it feasible to detect processing that violates the specified allocation information, and to notify software developers of the detection. As a result, when unintended access to the resources occurs because of software problems, then the problems can be pinpointed with ease, and consequently software development with improved efficiency is realized.

An eleventh aspect of the present invention provides a simulator operable to represent elements including a processor, using a plurality of simulated elements, and to simulate behaviors of the processor. The plurality of simulated elements includes: a memory element representing a memory operable to store executive instructions issued by the processor and data treated by the processor; a register element representing a register in the processor; and a control element representing a controller operable to access the memory element and/or the register element. The simulator includes: a command input unit operable to analyze an entered command and to operate the plurality of simulated elements; and a unit operable to check whether or not the memory element and/or the register element have or has been initialized.

A twelfth aspect of the present invention provides a simulator as defined in the eleventh aspect of the present invention, in which the unit operable to check whether or not the memory element and/or the register element have or has been initialized includes: a resource initialization information-containing unit operable to store information that shows whether or not the memory element and/or the register element have or has been initialized; and a resource initialization-analyzing unit operable to analyze, with reference to the resource initialization information-containing unit, whether or not the memory element and/or the register element to be accessed have or has been initialized when the control element provides access to the memory element and/or the register element.

The above constructions provide information on whether or not the resources have been initialized, and make it feasible to detect the occurrence of access to non-initialized resources during the execution of instructions that provide access to the resources, and to notify the software developers of the detection. As a result, when software problems bring about access to the non-initialized resources, then the problems can be pinpointed with ease, and consequently software development with improved efficiency is realized.

A thirteenth aspect of the present invention provides a simulator operable to represent elements including a processor, using a plurality of simulated elements, and to simulate behaviors of the processor. The plurality of simulated elements includes: a memory element representing a memory operable to store executive instructions issued by the processor and data treated by the processor; a register element representing a register in the processor; and a control element representing a controller operable to access the memory element and/or the register element. The simulator includes: a command input unit operable to analyze an entered command and to operate the plurality of simulated elements; and a unit operable to check how conditioned instructions executed by the control element are executed.

A fourteenth aspect of the present invention provides a simulator as defined in the thirteenth aspect of the present invention, in which the unit operable to check how the conditioned instructions executed by the control element are executed includes: a conditioned instruction execution state-analyzing unit operable to store address information on the conditioned instructions and a register value when the control element executes the conditioned instructions. The register value is referenced during the execution of the conditioned instructions.

The above constructions make it feasible to store a memory address of the conditioned instructions and a register value referenced to determine the conditions, during the execution of the conditioned instructions that execute processing, depending upon results from the reference to the register, and to notify the software developers of the stored information. This feature allows the software developers to ascertain how the conditioned instructions are executed, and to verify whether or not software to be run in all respects in accordance with the intent of the software developers. As a result, software operable with improved perfection (with improved reliability) is achievable.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 2 is an illustration showing a list of commands according to the first embodiment;

FIG. 3 is a flowchart illustrating a command input unit according to the first embodiment;

FIG. 15 is an illustration showing a list of commands according to the second embodiment;

FIG. 24 is an illustration showing a list of commands according to the third embodiment;

FIG. 33(*b*) is a descriptive illustration showing a prior art region access table.

DETAILED DESCRIPTION OF THE PREFERRED EMBODIMENTS

Preferred embodiments of the present invention are now described in conjunction with the accompanying drawings.

First Embodiment

The following discusses a first embodiment with reference to FIGS. 1-13.

Figure 1:
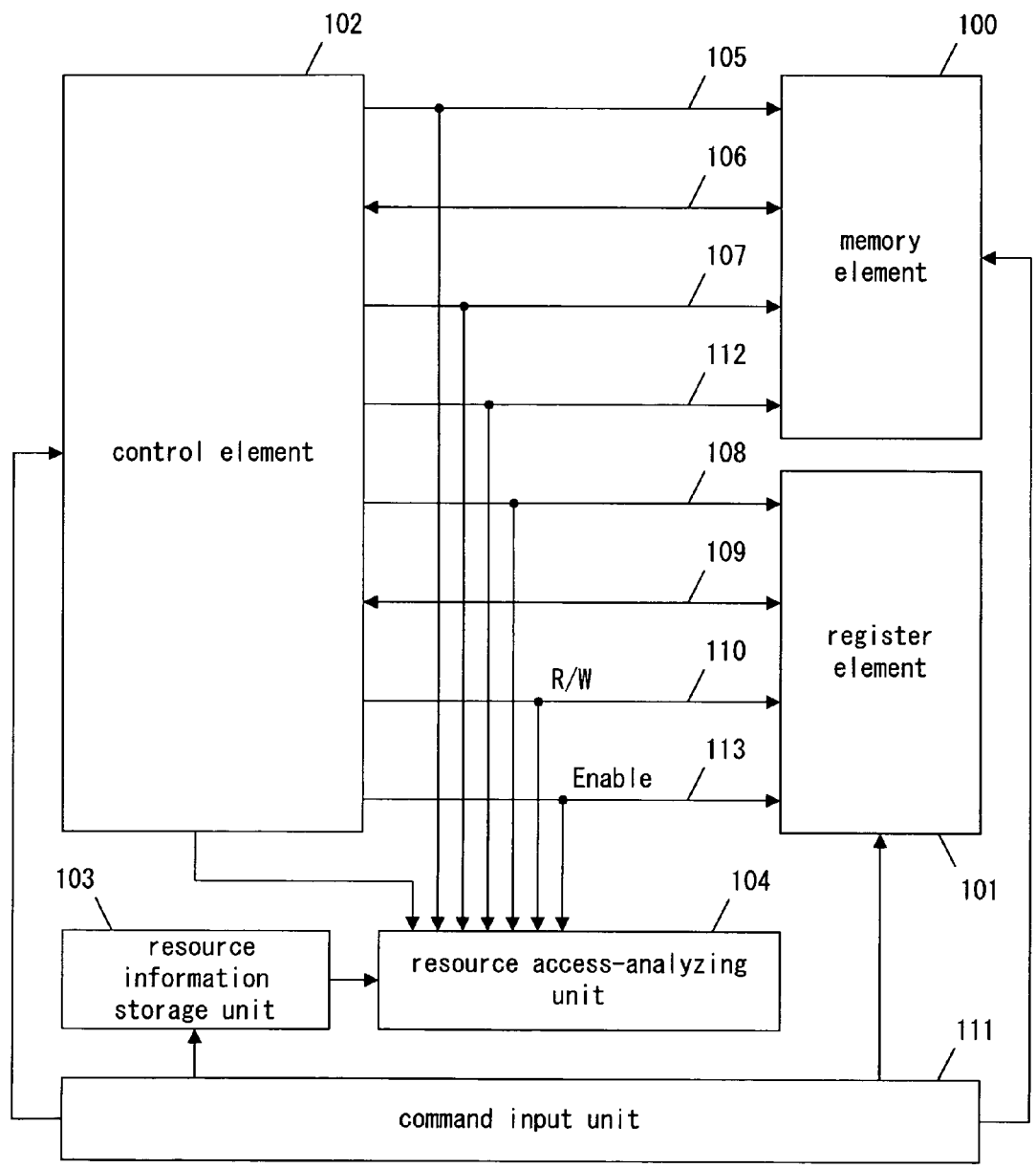
FIG. 1 is a block diagram illustrating a simulator according to a first embodiment of the present invention.

FIG. 1 is a block diagram illustrating a simulator according to the first embodiment.

A memory element 100 represents a memory that contains executive instructions from a processor and data in the processor.

A register element 101 represents at least one register that contains data for use in calculation.

A control element 102 represents a controller operable to read the execution instructions contained in the memory element 100, and to access the memory element 100 and register element 101 in accordance with the execution instructions, thereby reading/writing data.

The memory element 100, register element 101, and control element 102 are simulated elements that represent processor- and its peripheral-forming elements.

A resource information storage unit 103 contains resource information and a read/write classification (read/write information) for each piece of the resource information. The resource information includes a specified memory region range in the memory element 100 and a register classification contained in the register element 101.

A resource access-analyzing unit 104 is operable to compare access destinations (the memory element 100 and register element 101 to be accessed by the control element 102) and the read/write classification with the resource information and read/write information contained in the resource information storage unit 103, thereby practicing a resource access analysis as to whether or not the resource information includes the access destinations, and whether or not the read/write classification differs from the read/write information.

A command input unit 111 is operable to analyze entered commands to operate the control element 102, memory element 100, and register element 101, thereby executing processing in accordance with the commands.

The control element 102 is connected to the memory element 100 through an address line 105, a data line 106, a RW-line 107, and an enable line 112. The address line 105 transmits a specified address when the control element 102 provides access to the memory element 100. The data line 106 sends and receives read/write data. The RW-line 107 shows either read or write access. The enable line 112 shows whether or not the control element 102 is in the course of access to the memory element 100.

Similarly, the control element 102 is connected to the register element 101 through a selection line 108, a data line 109, a RW-line 110, and an enable line 113. The selection line 108 sends a specified register classification when the control element 102 provides access to the register element 101. The data line 109 sends and receives read/write data. The RW-line 110 shows either read or write access. The enable line 113 shows whether or not the control element 102 is in the course of access to the register element 101.

The above lines 105, 106, 107, 112, 108, 109, 110, and 113 are included in the simulated elements.

The simulator of FIG. 1 is realized by a gang of software modules that are run on a host processor such as a personal computer (PC) and a work station (WS).

As discussed above, the simulator according to the present embodiment includes a resource access-checking unit formed by the resource information storage unit 103 operable to store the resource information, and the resource access-analyzing unit 104 operable to analyze, with reference to the resource information, whether or not proper access to the resources is provided. The resource information includes the memory region range in the memory element, the read/write classification in the memory element, the register classification in the register element, and the read/write classification in the register element.

The resource information may be specified by commands. Alternatively, the resource information may be provided as data specified by commands. The resource information storage unit 103 is operable to store address range information on executive instructions from a processor. The resource access-analyzing unit 104 is operable to analyze whether or not proper executive instructions are provided, with reference to the address range information on the processor's executive instructions.

FIG. 2 is an illustration showing a list of commands, to which the simulator according to the present embodiment responds. Pursuant to the present embodiment, the simulator responds to a "LOAD-command", a "GO-command", an "ALLOC-command", a "LOADALLOC-command", and a "QUIT-command". These commands are, however, offered merely by way of illustration, and are susceptible to various changes.

The following discusses a format and function of each of the commands.

The "LOAD-command" is entered as "LOAD<file>". Executive instructions from a program file specified by the filename <file> are loaded into the memory element 100. For example, when a program file is provided as the filename "program.1st", then the command "LOAD program 1st" is entered.

The GO-command is entered as "GO". The entry of the GO-command drives the control element 102 to execute executive instructions that are contained in the memory element 100.

The "ALLOC-command" is used to set the resource information, PC-information, and the read/write information to practice a resource access analysis. When a specified resource is the memory 100, then the command "ALLOC MEM <SA> <EA> <SPC> <EPC> <RW>" is entered.

<SA> and <EA> are memory region ranges (start address and end address) to practice the resource access analysis. The memory region ranges <SA> and <EA> are specified in hexadecimal numeral. <SPC> and <EPC> are executive instruction address ranges (start address and end address) for practicing the resource access analysis. The address ranges <SPC> and <EPC> are specified in hexadecimal numeral. <RW> specifies the right of access to the memory regions specified by <SA> and <EA>. In the right-of-access <RW>, "R" is specified when only read is allowed; "W" when only write is allowed; and "RW" when both of the read and write are allowed. For example, the command "ALLOC MEM 100 1FF 0 F R" is specified when sixteen executive instructions contained in the memory element 100 at addresses "0x000" to "0x00F" are allowed to only read the memory element 100 at addresses "1x100" to "0x1FF".

When a resource specified by the "ALLOC-command" is the register 101, then the command "ALLOC REG <REGNAME> <SPC> <EPC> <RW>" is entered. <REGNAME> is a register classification for practicing a resource access analysis. The register classification <REGNAME> is specified by register names (REG0, REG1). <SPC>, <EPC>, and <RW> are similar to those used when the specified resource is the memory.

The "LOADALLOC-command" is entered as "LOADALLOC <file>". Upon the entry of this command, the resource information, PC-information, and read/write information for practicing the resource access analysis are read from an allocation file specified by the filename "<file>, thereby setting them in a predetermined manner.

The QUIT-command" is entered as "QUIT". The entry of this command terminates the simulator.

FIG. 3 illustrates a flow of processing in the command input unit 11 of FIG. 1.

The command input unit 11 responds to the five different commands (e.g. "LOAD") of FIG. 2. As illustrated in FIG. 3, when the simulator is activated, then at step 300, the simulator is ready to wait for the commands to enter. When one of the commands is entered, then at steps 301 to 305, different course of actions are provided dependent upon the entered command.

When the entered command is the "LOAD-command", then the routine is advanced from step 301 to step 306.

Figure 4:
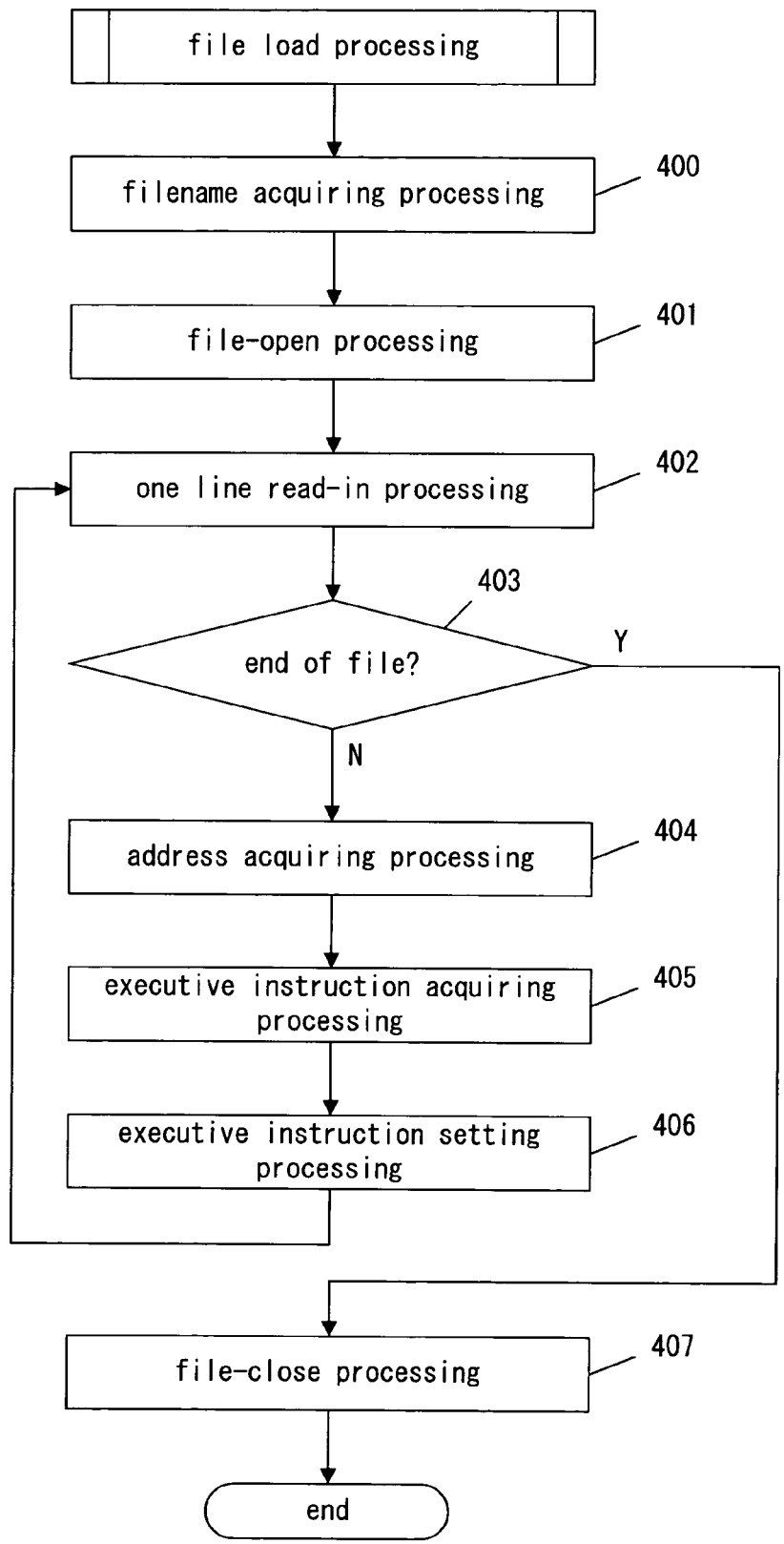
FIG. 4 is a flowchart illustrating details of step 306 according to the first embodiment.

The following discusses details of step 306 with reference to FIG. 4. FIG. 4 illustrates a flow of processing at step 306.

In the present processing, at step 400, a program filename specified by the "LOAD-command" is obtained. The filename is specified by the "LOAD-command" in the way as discussed above.

At step 401, the file obtained at step 400 is opened in a readable manner.

Figure 5:
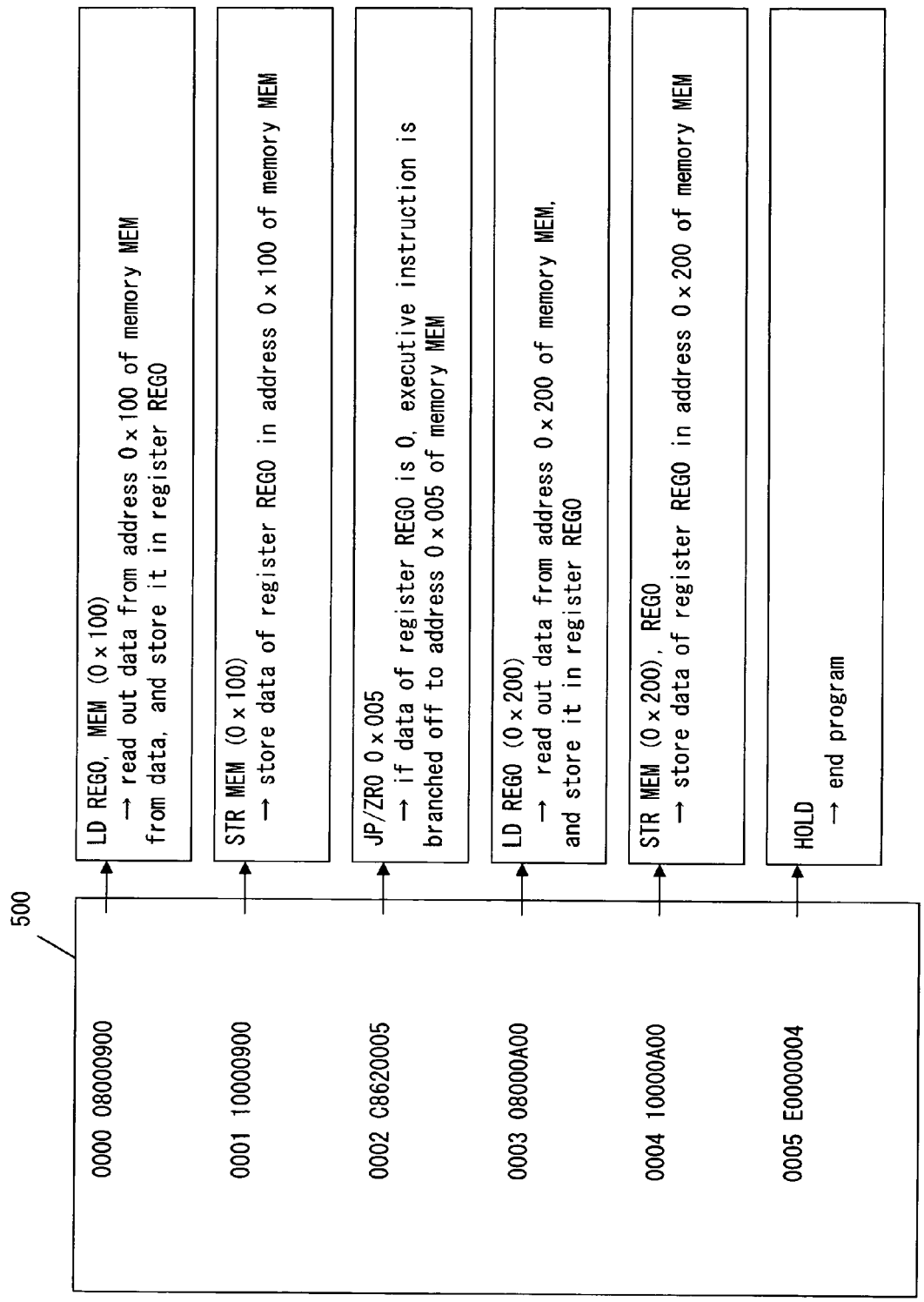
FIG. 5 is a descriptive illustration showing a program file according to the first embodiment.

The following discusses a program file specified by the "LOAD-command", with reference to FIG. 5.

FIG. 5 illustrates the program file according to the present embodiment. The program file 500 is assumed to be text data.

In the program file 500, executive instructions are described in each row. The leftmost, four digit character string (0000, 0001, etc. in hexadecimal numeral) in each of the rows is a memory address at which the executive instructions are loaded. The next character string (08000900, etc. in hexadecimal numeral) rightward spaced apart from the memory address by the distance of one or greater space is a code that represents the executive instructions. The description on the right side of the program file shows a type of assembler description on an executive instruction code in the program file 500 in each of the rows, and shows a type of processing to be executed.

The actual software development prepares assembler description-based source code files, and generates program files using a tool called "assembler". The "assembler" translates the source code files into codes that represent executive instructions as shown by the program file 500.

However, the "assembler"-based conversion from the source code files to the program files is irrelevant to the subject matter of the present invention, and therefore, detailed descriptions thereon are herein omitted.

For example, assume that the executive instruction code "08000900" in the first row of the program file 500 is an assembler description "LD REG0 MEM (0x100)". In this event, data is read from the memory element 100 at address 0x100, and the read data is written to the register element 101 at the register "REG0". Similarly, the subsequent pairs of memory addresses where the executive instructions are loaded, and executive instruction codes are arrange along the rows of the program file 500.

Although the program file 500 according to the present embodiment is text data, alternatively, it may be, of course, binary data. Although the program file 500 has the pair of memory address at which the executive instructions are loaded, and executive instruction code arranged in each of the rows, alternatively a single memory address where the executive instructions are loaded, and a plurality of executive instruction codes may be arrayed in each of the rows. In the alternative, all of the executive instructions are loaded at one-by-one incremented addresses beginning at the memory address where the executive instructions are loaded.

Now, referring back to FIG. 4, at step 402, a line of data is read from the program file opened at step 401. This means that "0000 08000900" is read from the program file of FIG. 5.

At step 403, a determination is made as to whether or not the line read at step 402 is the end of the file. When the answer to the destination in step 403 results in "YES", then the routine is branched off to step 407, but otherwise the routine is advanced to step 404.

At step 404, a memory address at which executive instructions are loaded is obtained from the line "0000 08000900" that was read at step 402. In the line "0000 08000900", the above memory address is "0000".

At step 405, an executive instruction code is obtained from the line "0000 08000900" that was read at step 402. In the line "0000 08000900", the executive instruction code is "08000900".

At step 406, executive instructions are set in the memory element 100 at a specified address on the basis of the memory address at which the executive instructions are loaded, and the executive instruction code, both of which were obtained at steps 404 and 405, respectively.

The steps 402 to 406 are repeated until the end of the file is reached. When the end of the file is reached, then at step 407, the program file opened at step 401 is closed, and the routine is terminated.

Referring back to FIG. 3, when the entered command is the "ALLOC-command", then the routine is advanced from step 302 to step 307.

Figure 6:
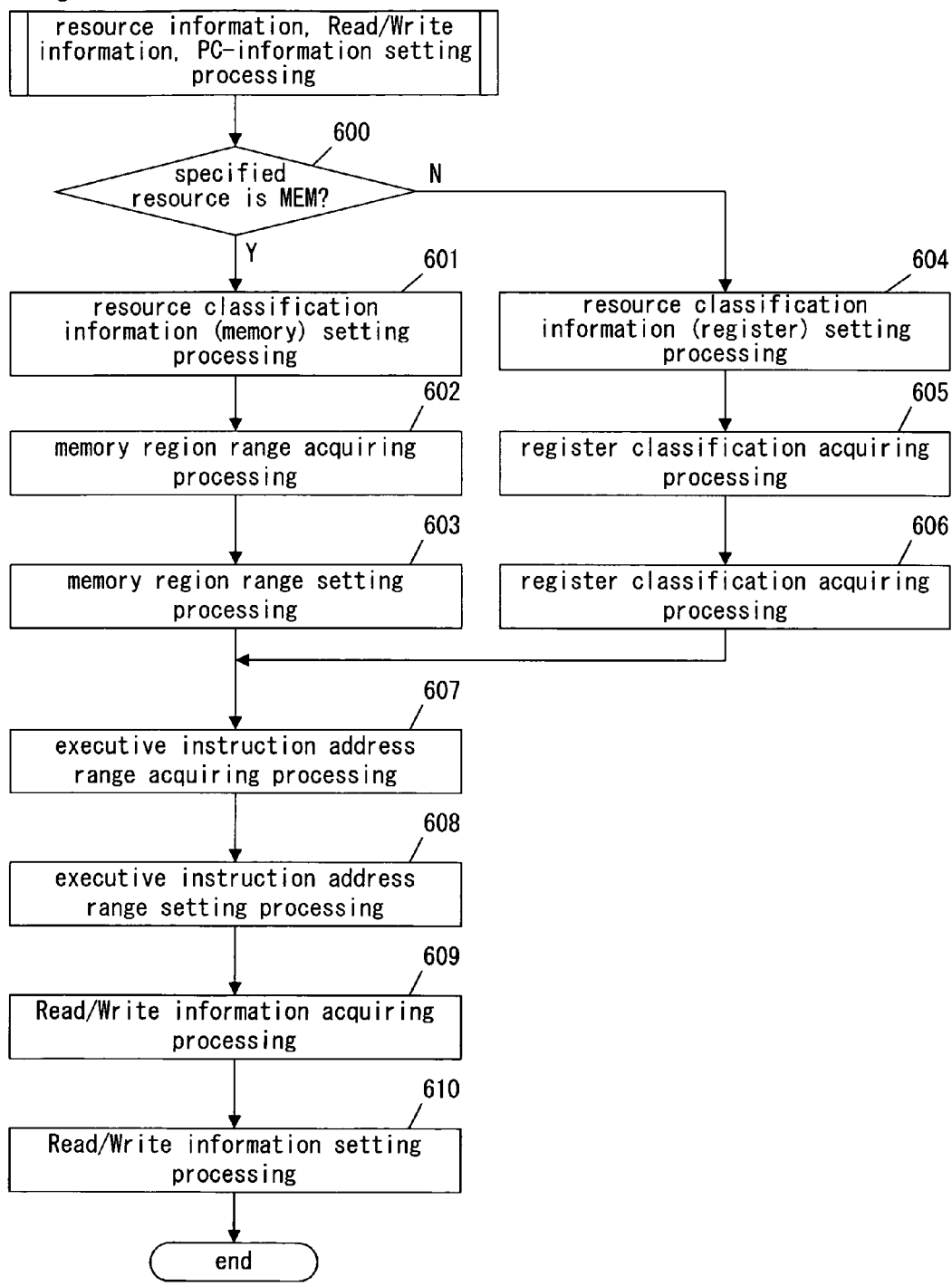
FIG. 6 is a flowchart illustrating details of step 307 according to the first embodiment.

The following discusses details of step 7 with reference to FIG. 6.

FIG. 6 illustrates a flow of processing at step 307.

In the present processing, at step 600, a determination is made as to whether or not a resource specified by the "ALLOC-command" is either the memory (MEM) or the register (REG). When it is determined at step 600 that the resource specified by the "ALLOC-command" is the memory (MEM), then the routine is advanced to step 601.

At step 601, a resource classification (memory) is placed into an allocation information table.

Figure 7:
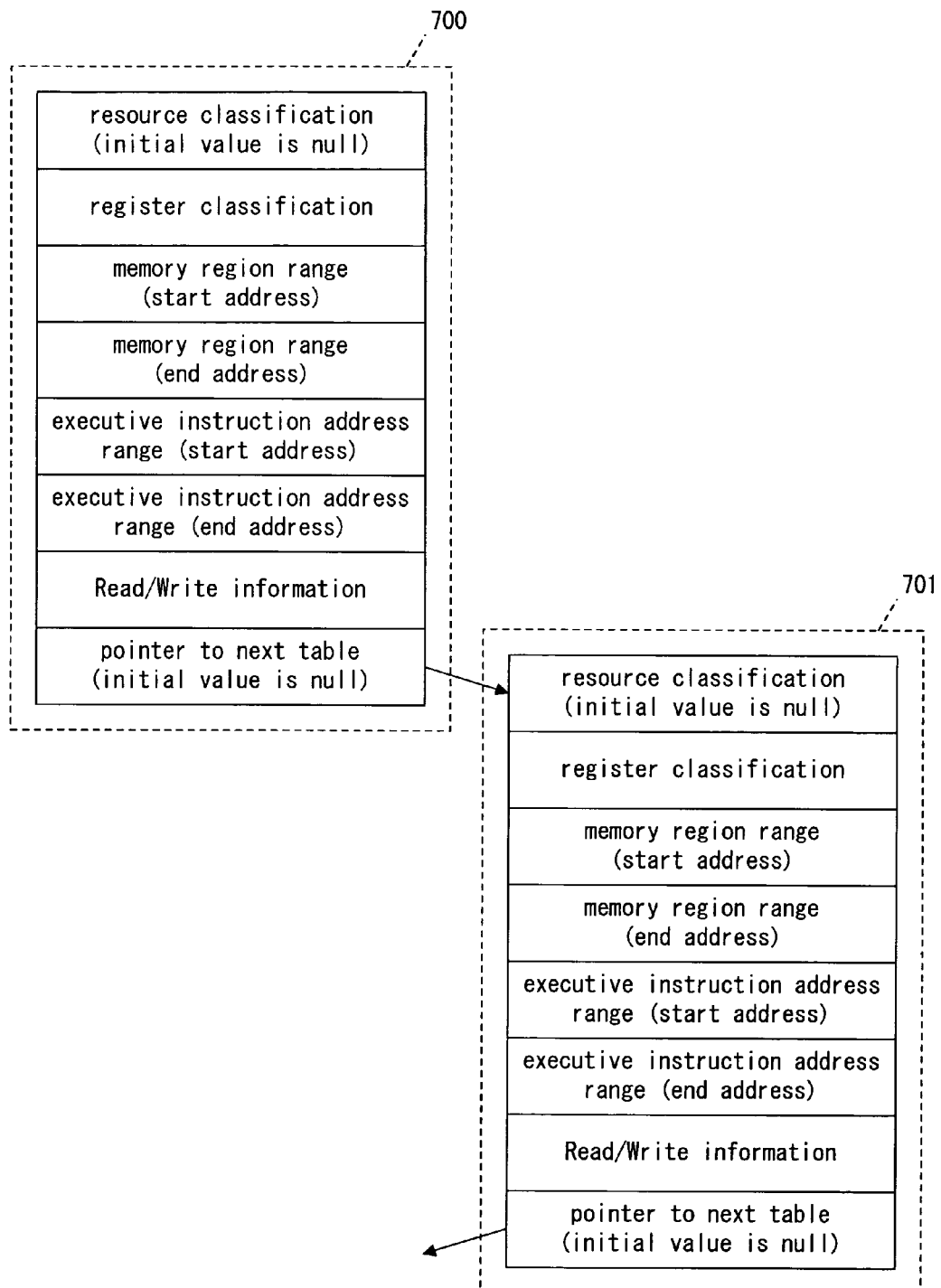
FIG. 7 is a descriptive illustration showing an allocation information table according to the first embodiment.

The following discusses the allocation information table with reference to FIG. 7.

FIG. 7 is a descriptive illustration showing the allocation information table according to the present embodiment.

The allocation information table 700 includes elements that follows: "resource classification"; "register classification"; "memory region range (start address)"; "memory region rang (end address)"; "executive instruction address range (start address)"; "executive instruction address range (end address)"; "read/write information"; and "pointer to the next table".

The "resource classification" element contains a resource classification specified by either "ALLOC-command" or "LOADALLOC-command" (the latter command" is discussed later). Assume that the resource classification is "0" for the memory (MEM), but is "1" for the register (REG).

The "register classification" element contains a register classification that is specified by either "ALLOC-command" or "LOADALLOC-command" (discussed later) when the resource classification is the register (REG). Assume that the register classification is "0" for REG0, but is "1" for REG1.

In the "memory region range (start address)" element and the "memory region rang (end address)" element, a memory region range (start address) specified by either "ALLOC-command" or "LOADALLOC-command" (discussed later), and a memory region range (end address) specified thereby are set when the resource classification is the memory (MEM).

In the "executive instruction address range (start address)" element and the "executive instruction address range (end address)" element, an executive instruction address range (start address) specified by either "ALLOC-command" or "LOADALLOC-command" (discussed later), and an executive instruction address range (end address) specified thereby are set.

The "read/write information" element contains the right of access to a resource specified by either "ALLOC-command" or "LOADALLOC-command" (discussed later). In this instance, "0" is set when the right of access is allowed only for read (R); "1" is set only for write (W); and "2" is set for both of the read and write (RW).

In the "pointer to the next table" element, a pointer to the next table is set when several pieces of allocation information are specified by either several "ALLOC-commands" or several "LOADALLOC-commands" (discussed later). In the "pointer to the next table", an initial value is null.

The present allocation information tables 700, 701, etc. are disposed in the resource information storage unit 103.

Referring back to FIG. 6, at step 602, a memory region range (start address) specified by the "ALLOC-command" and a memory region range (end address) specified thereby are obtained.

At step 603, the memory region range (start address) and memory region range (end address) obtained at the previous step 602 are set in the allocation information table.

At step 600, when a resource specified by the "ALLOC-command" is the register (REG), then the routine is advanced to step 604.

At step 604, the resource classification (register) is placed into the allocation information table.

At step 605, register classifications (REG0, REG1) specified by the "ALLOC-command" are obtained.

At step 606, the register classifications obtained at the previous step 605 is set in the allocation information table.

At step 607, an executive instruction address range (start address) specified by the "ALLOC-command" and an executive instruction address range (end address) specified thereby are obtained.

At step 608, the executive instruction address range (start address) and executive instruction address range (end address) obtained at the previous step 607 are set in the allocation information table.

At step 609, right-of-access information (R, W, RW) specified by the "ALLOC-command" is obtained.

At step 610, the right-of-access information obtained at the previous step 609 is set in the allocation information table, and the routine is terminated.

Referring back to FIG. 3, when the entered command is the "LOADALLOC-command", then the routine is advanced from step 303 to step 308.

Figure 8:
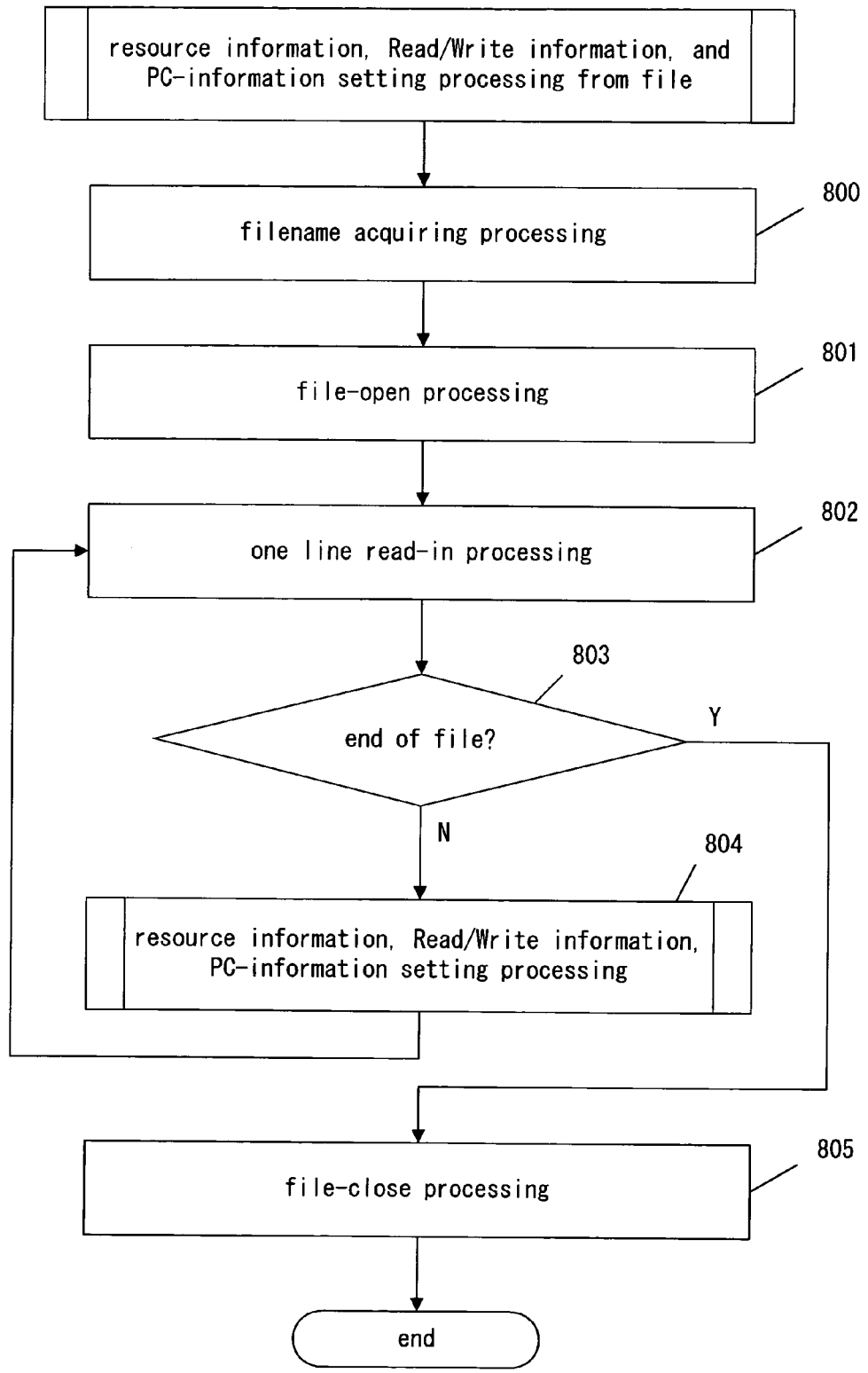
FIG. 8 is a flowchart showing details of step 308 according to the first embodiment.

The following discusses details of step 308 with reference to FIG. 8.

FIG. 8 illustrates a flow of processing at step 308.

In the present processing, at step 800, an allocation filename specified by the LOADALLOC-command" is obtained.

At step 801, the allocation file obtained at the previous step 800 is opened in a readable manner.

Figure 9:
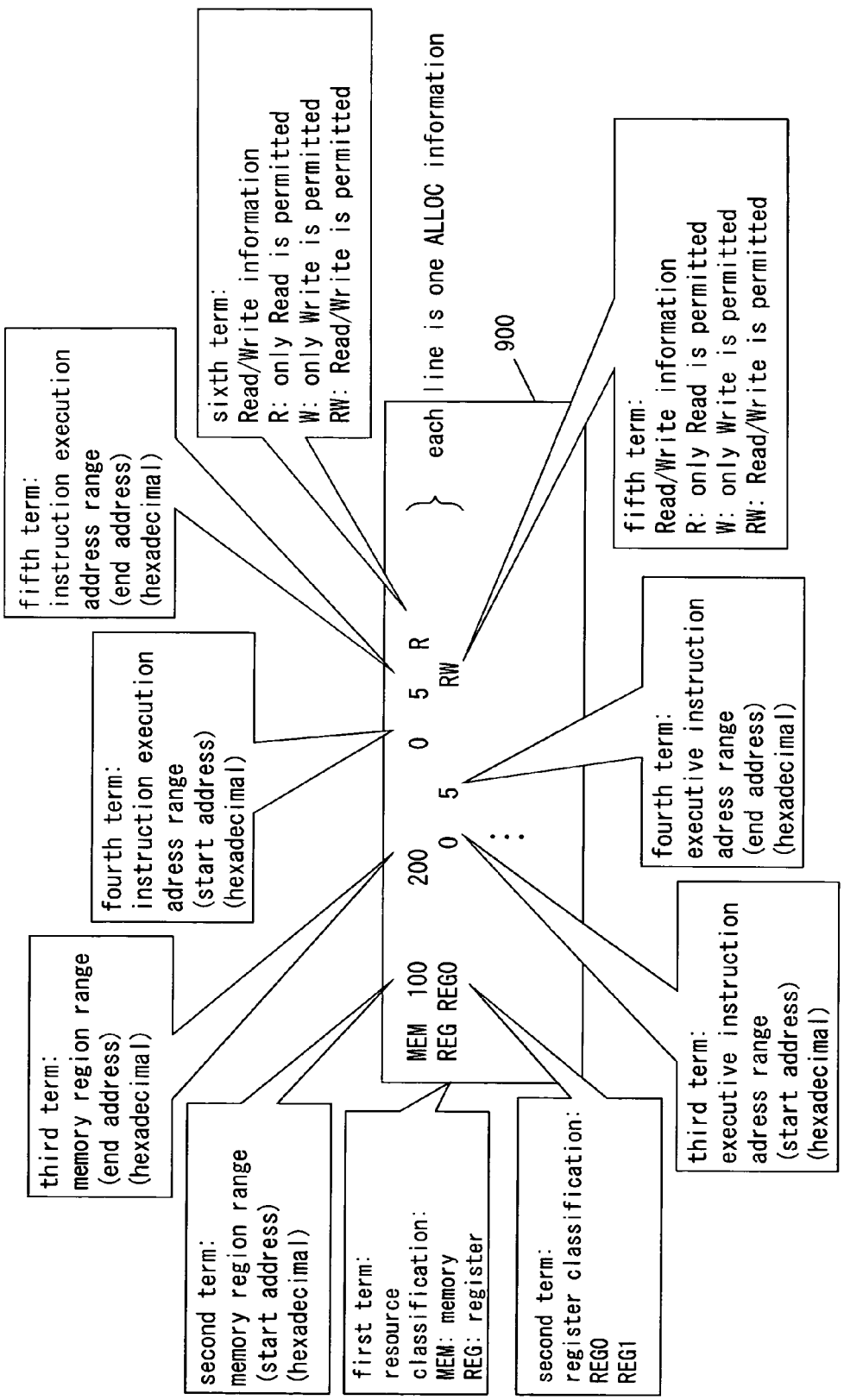
FIG. 9 is a descriptive illustration showing an allocation file according to the first embodiment.

The following discusses the allocation file with reference to FIG. 9.

FIG. 9 is a descriptive illustration showing the allocation file according to the present embodiment.

In the present embodiment, the allocation file 900 is assumed to be text data. In the allocation file 900, each line includes a piece of allocation information, i.e., a resource classification, memory region ranges (start address, end address), a register classification, executive instruction address ranges (start address, end address), and the right of access.

In each of the lines, the "resource classification" is given at the leftmost end thereof (first term). In the present embodiment, the "resource classification" is "MEM" when a specified resource is the memory, but the "resource classification" is "REG" when the specified resource is the register. Subsequent settings differ, depending upon whether or not the resource classification is either the memory (MEM) or the register (REG). Assume that each of the settings (x-th term) is separated by one or greater separator (or space according to the present embodiment).

The following discusses the settings when the resource classification is the memory (MEM).

At second and third terms next to the "resource classification" on the right side thereof, the "memory region range (start address)" and "memory region range (end address)" for performing a resource access analysis are consecutively specified in hexadecimal numeral.

At fourth and fifth terms next to the "memory region range (end address)" on the right side thereof, the "executive instruction address range (start address)" and "executive instruction address range (end address)" for performing the resource access analysis are consecutively specified in hexadecimal numeral.

A sixth term next to the "executive instruction address range (end address)" on the right side thereof specifies the right of access to a memory region specified by the above memory region ranges (start address, end address). The access right "R" is specified when only read is allowed; "W" is specified when only write is allowed; and "RW" is specified when both of the read and write are allowed.

When the resource classification is the register (REG), a second term next to the "resource classification" on the right side thereof is a "register classification" specified by the register names (REG0, REG1) for performing the resource access analysis.

At third and fourth terms next to the "register classification" on the right side thereof, the "executive instruction address range (start address)" and "executive instruction address range (end address)" for practicing the resource access analysis are consecutively specified in hexadecimal numeral.

A fifth term next to the "executive instruction address range (end address)" on the right side thereof specifies the right of access to the register specified by the above register classification. The access right "R" is specified when only read is allowed; "W" is specified when only write is allowed; and "RW" is specified when both of the read and write are allowed.

Although the allocation file 900 according to the present embodiment is text data, binary data instead of the text data may be used without any problem. Each of the settings described in the allocation file 900 is changeable in format.

Referring back to FIG. 8, at step 802, a line of data is read from the file opened at step 801. This means that "MEM 100 200 0 5 R" is read from the allocation file 900 of FIG. 9.

At step 803, when the end of the file is reached upon the readout of the data at step 802, then the routine is advanced to step 805, but otherwise the routine is advanced to step 804.

At step 804, the allocation information obtained at step 802 is placed into the allocation information table. The allocation information is treated in the same manner as done at step 307.

Step 802 to step 804 are repeated until the end of the file is reached. When the end of the file is reached, then at step 805, the allocation file opened at step 801 is closed, and the routine is terminated.

Referring back to FIG. 3, when the entered command is the "GO-command", then the routine is advanced from step 304 to step 309.

Figure 10:
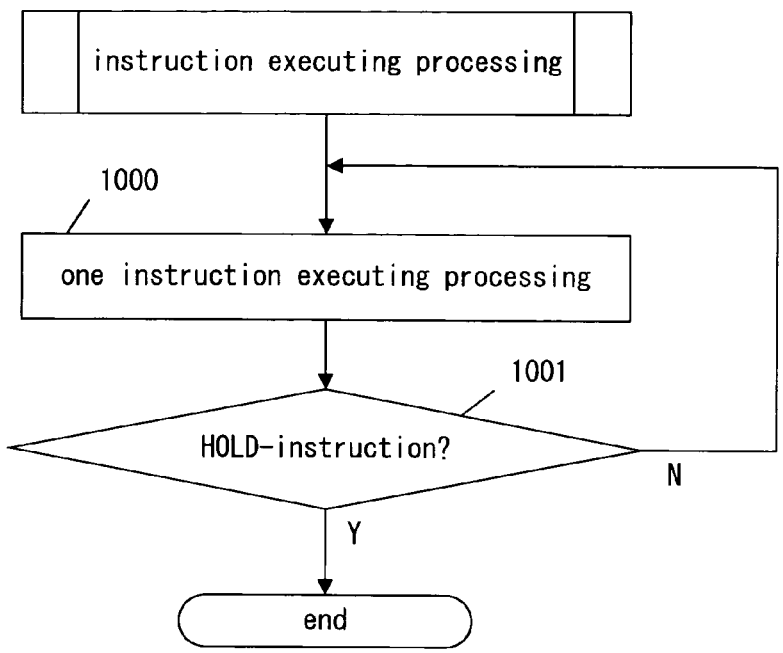
FIG. 10 is a flowchart illustrating details of step 309 according to the first embodiment.

The following discusses details of step 309 with reference to FIG. 10.

FIG. 10 illustrates a flow of processing at step 309.

In the present processing, at step 1000, one of the executive instructions contained in the memory element 100 is executed. According to the present embodiment, the execution begins with address 0x000 in the memory element 100. Referring to FIG. 5 in which the program file 500 is loaded in the memory element 100, the instructions "LD REG0, MEM (0x100)" are executed, which means that data is read out from the memory element 100 at address 0x100, and the read data is written to the register "REG0".

At step 1001, when the instructions executed at the previous step 1000 are "HOLD"-instructions, then the instructions are stopped from being executed, but otherwise the routine is returned to step 1000 to execute the next instructions.

In the program file 500 of FIG. 5, the instructions "LD REG0, MEM (0x100) are followed by the instructions "STR MEM (0x100), REG0", etc. Eventually, the program is stopped after the instructions "HOLD" are executed.

While the instructions are executed in response to the "GO-command", the resource access-analyzing unit 104 checks how the resources are accessed, in accordance with the allocation information specified in the allocation information table by the "ALLOC-command" and "LOADALLOC-command".

Figure 11:
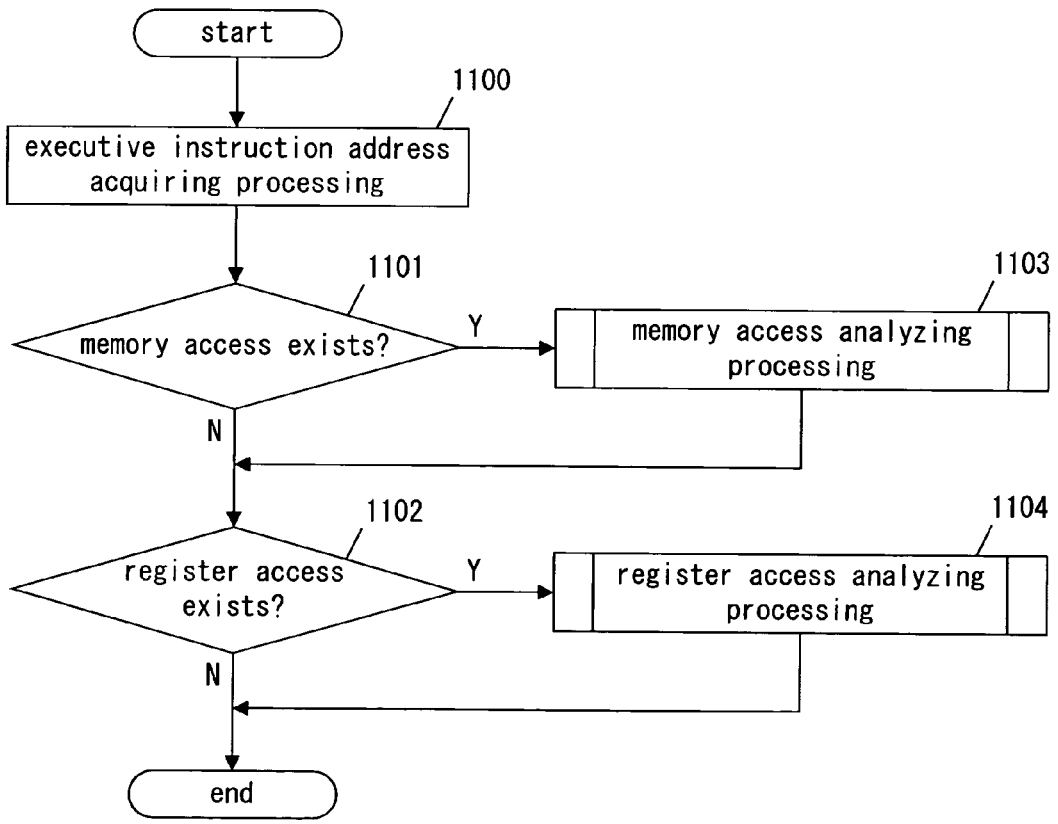
FIG. 11 is a flowchart illustrating a resource access-analyzing unit according to the first embodiment.
Figure 12:
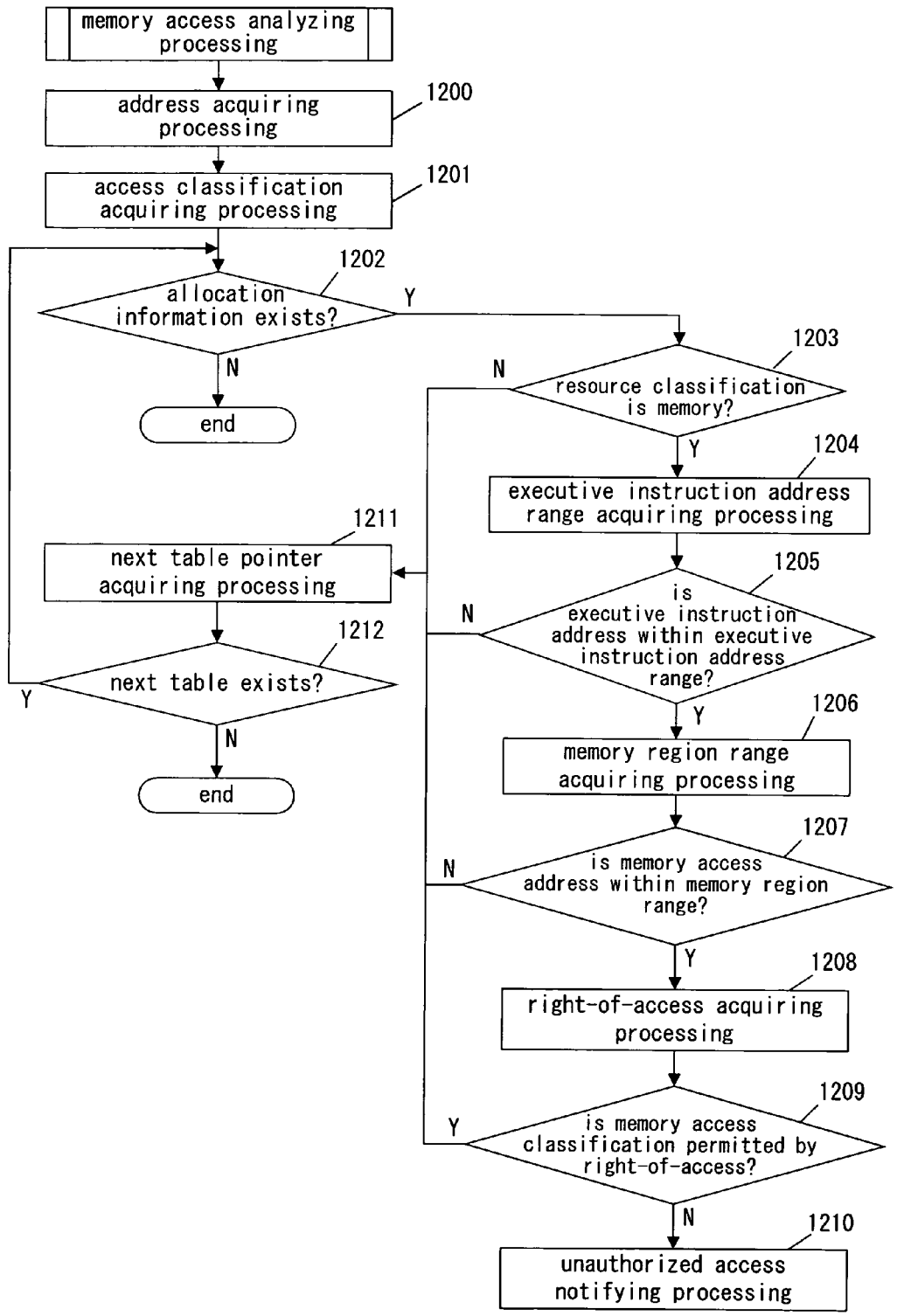
FIG. 12 is a flowchart illustrating details of step 1103 according to the first embodiment.
Figure 13:
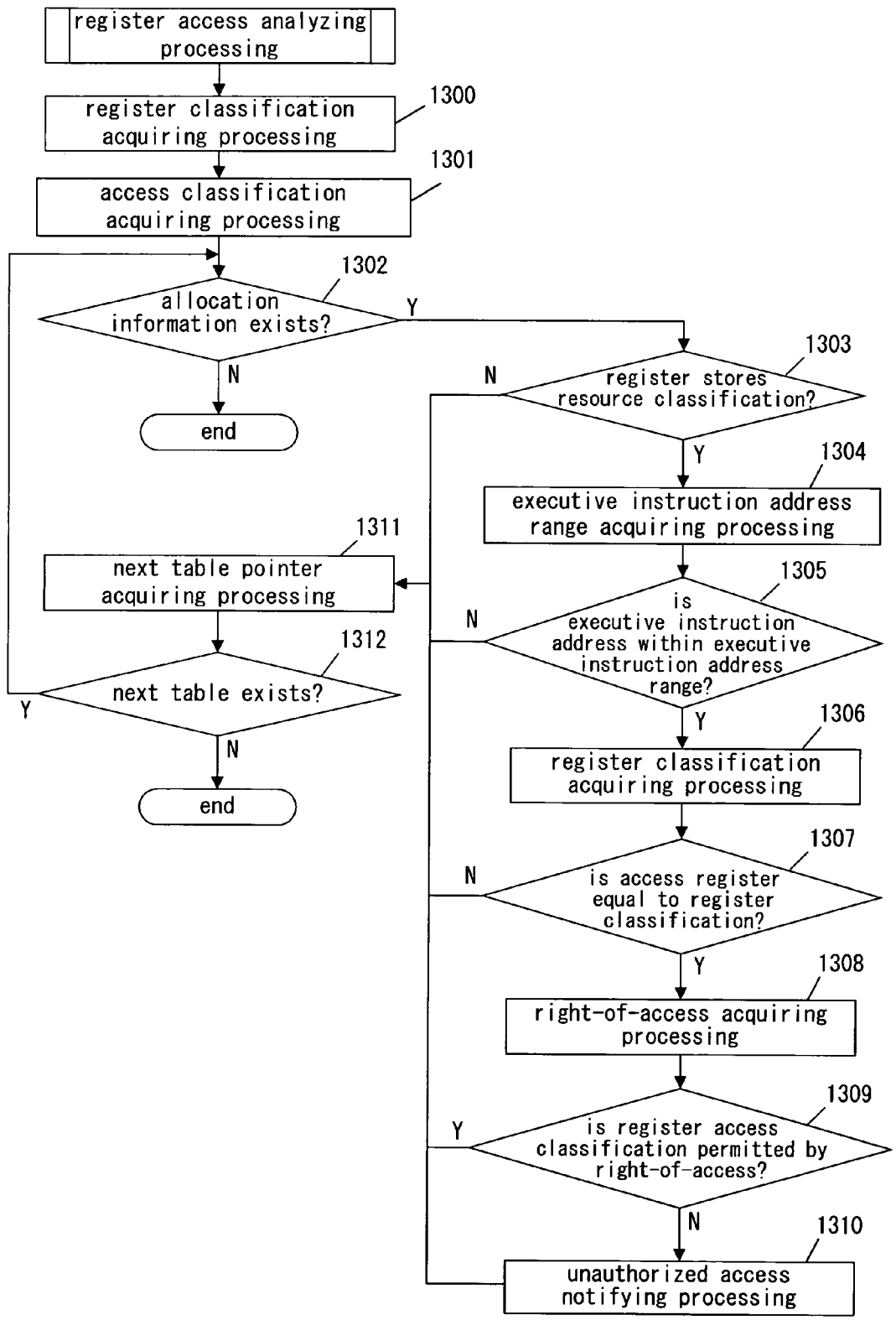
FIG. 13 is a flowchart illustrating details of step 1104 according to the first embodiment.

The following discusses details of the resource access-analyzing unit 104 with reference to FIGS. 11, 12, and 13.

FIG. 11 illustrates a flow of processing in the resource access-analyzing unit 104.

In the present processing, at step 1100, an address of instructions currently executed by the control element 102 is obtained.

At step 1101, a determination is made as to whether or not the executive instructions provide access to the memory element 100 (whether or not the enable line 112 is operative). When the answer to the determination in step 1101 results in "YES", the routine is advanced to step 1103.

The following discusses details of step 1103 with reference to FIG. 12. FIG. 12 illustrates a flow of processing at step 1103.

In the present processing, at step 1200, the resource access-analyzing unit 104 checks up on the address line 105 to obtain an address in the memory element 100, to which the executive instructions provide access.

At step 1201, the resource access-analyzing unit 104 checks up on the RW line 107 to obtain an executive instruction access classification (read or write).

At step 1202, the resource access-analyzing unit 104 checks the allocation information table in the resource information storage unit 103 to see whether or not the allocation information is set in the allocation information table.

More specifically, the resource access-analyzing unit 104 determines that the allocation information is absent, when the "resource classification" element in the allocation information table is null, but otherwise the resource access-analyzing unit 104 determines that the allocation information is present. When it is determined at step 1202 that the allocation information is absent, then the routine is terminated. When it is determined at step 1202 that the allocation information is present, then the routine is advanced to step 1203.

At step 1203, the resource access-analyzing unit 104 determines whether or not the "resource classification" element in the allocation information table is set to be the memory (MEM). When the answer to the determination in step 1203 results in "NO", then the routine is branched off to step 1211, but otherwise the routine is advanced to step 1204.

When the "resource classification" element is the memory (MEM), then at step 1204, the resource access-analyzing unit 104 obtains executive instruction address ranges from the allocation information table at the "executive instruction address range (start address)" element and at the "executive instruction address range (end address)" element.

At step 1205, the resource address-analyzing unit 104 determines whether or not the executive instruction address ranges obtained at the previous step 1204 include the executive instruction address obtained at step 1100. When the answer to the determination in step 1205 results in "NO", then the routine is branched off to step 1211, but otherwise the routine is advanced to step 1206.

When the answer to the determination in step 1205 results in "YES", then at step 1206, memory region ranges are obtained from the allocation information table at the "memory region rang (start address)" element and at the "memory region range (end address)" element.

At step 1207, the resource access-analyzing unit 104 determines whether or not the memory region ranges obtained at step 1206 include the address obtained at step 1200, to which the executive instructions provide access. When the answer to the determination in step 1207 results in "NO", then the routine is branched off to step 1211, but otherwise it is advanced to step 1208.

When the answer to the determination in step 1207 results in "YES", then at step 1208, the resource access-analyzing unit 104 obtains right-of-access information from the allocation information table at the "read/write information" element.

At step 1209, the resource address unit 104 determines whether or not the executive instruction access classification obtained at step 1201 is coincident with the right of access obtained at step 1208. When the answer to the determination in step 1209 results in "YES", then the routine is branched off to step 1211, but otherwise the routine is advanced to step 1210.

When the answer to the determination in step 1209 results in "NO", then at step 1210, the resource access-analyzing unit 104 notifies software developers of the occurrence of unauthorized access to the resources on the basis of the allocation information. The notification may be made in any way, but may be, e.g., displayed on an output apparatus such as a display (not shown).

At step 1211, the resource access-analyzing unit 104 obtains a pointer to the next allocation information table from the allocation information table at the "pointer to the next table" element.

At step 1212, the resource access-analyzing unit 104 determines whether or not a further allocation information table is present. More specifically, the resource access-analyzing unit 104 determines that the next allocation information table is absent, when the "pointer to the next table" element in the allocation information table is null, but otherwise the resource access-analyzing unit 104 determines that the next allocation information table is present.

When the determination in step 1212 is made that the next allocation information table exists, then the routine is returned to step 1202. When the determination in step 1212 is made that the next allocation information table is absent, then the routine is terminated.

Referring back to FIG. 11, at step 1102, the resource access-analyzing unit 104 determines whether or not the executive instructions provide access to the register element 101 (whether or not the enable line 113 is operative). When the answer to the determination in step 1102 results in "YES", the routine is advanced to step 1104.

The following discusses details of step 1104 with reference to FIG. 13. FIG. 13 illustrates a flow of processing at step 1104.

In the present processing, at step 1300, the resource access-analyzing unit 104 checks up on the selection line 108 to obtain a register classification in the register element 101, to which the executive instructions provide access.

At step 1301, the resource access-analyzing unit 104 checks up on the RW-line 109 to obtain an executive instruction access classification (read or write).

At step 1302, the resource access-analyzing unit 104 checks the allocation information table in the resource information storage unit 103 to determine whether or not the allocation information is set in the allocation information table. More specifically, the resource access-analyzing unit 104 determines that the allocation information is absent, when the "resource classification" element in the allocation information table is null, but otherwise the resource access-analyzing unit 104 determines that the allocation information is present.

When it is determined at step 1302 that the allocation information is absent, then the routine is terminated. When it is determined at step 1302 that the allocation information is present, then the routine is advanced to step 1303.

At step 1303, the resource access-analyzing unit 104 determines whether or not the "resource classification" element in the allocation information table is set to be the register (REG). When the answer to the determination in step 1303 results in "NO", then the routine is branched off to step 1311, but otherwise the routine is advanced to step 1304.

When it is determined at step 1303 that the "resource classification" element is the register (REG), then at step 1304, the resource access-analyzing unit 104 obtains executive instruction address ranges from the allocation information table at the "executive instruction address range (start address)" element and at the "executive instruction address range (end address)" element.

At step 1305, the resource access-analyzing unit 104 determines whether or not the executive instruction address ranges obtained at the previous step 1304 include the executive instruction address obtained at step 1100. When the answer to the determination in step 1305 results in "NO", then the routine is branched off to step 1311, but otherwise the routine is advanced to step 1306.

When the answer to the determination in step 1305 results in "YES", then at step 1306, the resource access-analyzing unit 104 obtains a register classification from the allocation information table at the "register classification" element.

At step 1307, the resource access-analyzing unit 104 determines whether or not the register obtained at step 1300, to which the executive instructions provide access, is coincident with the register classification obtained at step 1306. When the answer to the determination in step 1307 results in "NO", then the routine is branched off to step 1311, but otherwise the routine is advanced to step 1308.

When the answer to the determination in step 1307 results in "YES", then at step 1308, the resource access-analyzing unit 104 obtains the right-of-access information from the allocation information table at the "read/write information" element.

At step 1309, the resource access-analyzing unit 104 determines whether or not the executive instruction access classification obtained at step 1301 is coincident with the right of access obtained at step 1308. When the answer to the determination in step 1309 results in "YES", then the routine is branched off to step 1311, but otherwise the routine is advanced to step 1310.

When the answer to the determination in step 1309 results in "NO", then at step 1310, the resource access-analyzing unit 104 notifies the software developers of the occurrence of unauthorized access to the resources on the basis of the allocation information. The notification may be made in any way, but may be, e.g., displayed on an output apparatus such as a display (not shown).

At step 1311, the resource access-analyzing unit 104 obtains a pointer to the next allocation information table from the allocation information table at the "pointer to the next table" element.

At step 1312, the resource access-analyzing unit 104 determines whether or not a further allocation information table is present. More specifically, the resource access-analyzing unit 104 determines that the next allocation information table is absent, when the "pointer to the next table" element in the allocation information table is null, but otherwise the resource access-analyzing unit 104 determines that the next allocation information table is present. When it is determined at step 1312 that the next allocation information table is present, then the routine is returned to step 1302. When it is determined at step 1312 that the next allocation information table is absent, then the routine is terminated.

Referring back to FIG. 3, when the entered command is the "QUIT command, then the simulator is terminated.

As described above, the simulator according to the present embodiment is operable to specify target allocation information (e.g., executive instruction address ranges, resources to which access is permitted to provide, and access classifications (read and write)) in advance to execute instructions, thereby detecting processing that violates the specified allocation information, and notifying the software developer of the detection. The practice of software development using the simulator according to the present invention allows software problems to be pinpointed with ease when unintended access to the resources occurs because of the software problems. This feature allows for improved efficiency in software development.

Second Embodiment

A second embodiment is now described with reference to FIG. 11 and FIGS. 14 to 22.

Figure 14:
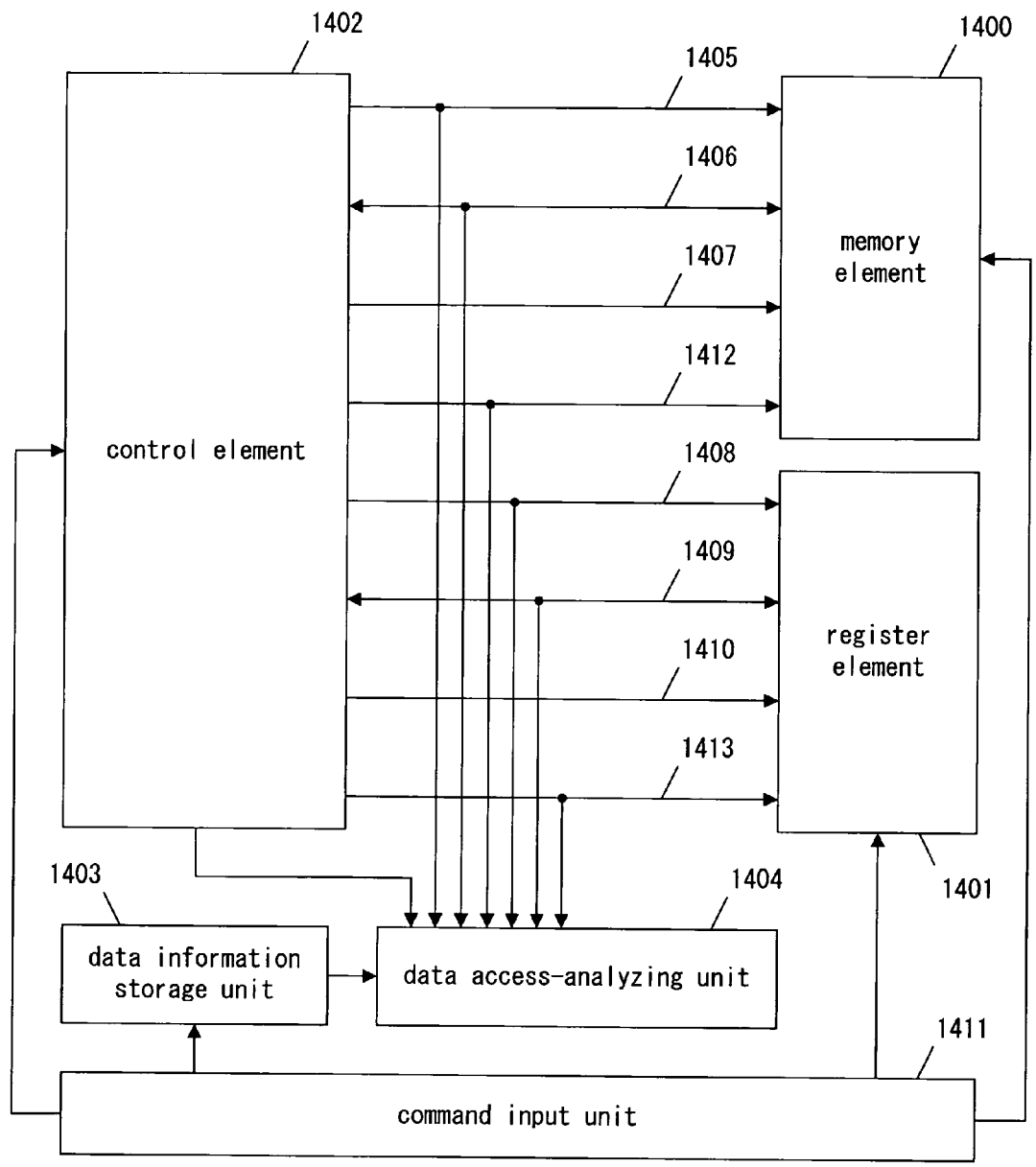
FIG. 14 is a block diagram illustrating a simulator according to a second embodiment.

FIG. 14 is a block diagram illustrating a simulator according to the present embodiment.

A memory element 1400 represents a memory that contains executive instructions from a processor and data in the processor.

A register element 1401 represents at least one register that contains data for use in calculation.

A control element 1402 represents a controller operable to read the executive instructions contained in the memory element 1400, and to access the memory element 1400 and register element 1401 in accordance with the executive instructions, thereby reading/writing the data.

The memory element 1400, register element 1401, and control element 1402 are simulated elements that represent processor- and its peripheral-forming elements.

A data information storage unit 1403 contains resource information and a data range for each piece of the resource information. The resource information includes a specified memory region range in the memory element 1400 and a register classification contained in the register element 1401.

A data access-analyzing unit 1404 is operable to compare access destinations (the memory element 1400 and register element 1401 to be accessed by the control element 140) and data with the resource information and data ranges contained in the data information storage unit 1403, thereby practicing a data access analysis as to whether or not the resource information includes the access destinations, and whether or not the data ranges include data obtained during the access to the memory element 1400 and register element 1401.

A command input unit 1411 is operable to analyze entered commands to operate the control element 1402, memory element 1400, and register element 1401, thereby executing processing in accordance with the commands.

The control element 1402 is connected to the memory element 1400 through an address line 1405, a data line 1406, a RW-line 1407, and an enable line 1412. The address line 1405 transmits a specified address when the control element 1402 provides access to the memory element 1400. The data line 1406 sends and receives read/write data. The RW-line 1407 shows either read or write access. The enable line 1412 shows whether or not the control element 1402 is in the course of access to the memory element 1400.

Similarly, the control element 1402 is connected to the register element 1401 through a selection line 1408, a data line 1409, a RW-line 1410, and an enable line 1413. The selection line 1408 sends a specified register classification when the control element 1402 provides access to the register element 1401. The data line 1409 sends and receives read/write data. The RW-line 1410 shows either read or write access. The enable line 1413 shows whether or not the control element 1402 is in the course of access to the register element 1401.

The above lines 1405, 1406, 1407, 1412, 1408, 1409, 1410, and 1413 are included in the simulated elements.

The simulator of FIG. 14 is realized by a gang of software modules that are run on a host processor such as a personal computer (PC) and a work station (WS).

The simulator according to the present embodiment includes a data access-checking unit formed by the data information storage unit 1403 operable to store data information, and the data access-analyzing unit 1404 operable to analyze, with reference to the data information, whether or not proper data access is provided. The data information includes a memory region range in the memory element, a read/write classification in the memory element, a register classification in the register element, and a read/write classification in the register element. The data information may be specified by commands. Alternatively, the data information may be provided as data specified by the commands.

The data information storage unit 1403 is operable to store address range information on executive instructions from a processor. The data access-analyzing unit 1404 is operable to analyze whether or not proper executive instructions are made, with reference to the address range information on the processor's executive instructions.

FIG. 15 is an illustration showing a list of commands, to which the simulator according to the present embodiment responds. Pursuant to the present embodiment, the simulator responds to a "LOAD-command", a "GO-command", an "ALLOCD-command", a "LOADALLOCD-command", and a "QUIT-command". These commands may, of course, be susceptible to various changes.

The following discusses a format and function of each of the commands. The "LOAD-command", "GO-command", "QUIT-command" are similar to those according to the previous embodiment.

The "ALLOCD-command" is used to set the resource information, PC-information, and the data ranges for performing a data access analysis. When a specified resource is the memory 1400, then the command "ALLOCD MEM <SA> <EA> <SPC> <EPC> <MIN> <MAX>" is entered. <SA> and <EA> are memory region ranges (start address and end address) for conducting the data access analysis. The memory region ranges <SA> and <EA> are specified in hexadecimal numeral.

<SPC> and <EPC> are an executive instructions address ranges (start address, end address) for conducting the data access analysis. The address ranges <SPC> and <EPC> are specified in hexadecimal numeral. <MIN> and <MAX> are data ranges (minimum values, maximum value) to be permitted during access to the memory regions specified by <SA> and <EA>. The data ranges <MIN> and <MAX> are specified in hexadecimal numeral. For example, assume that sixteen executive instructions in the memory element 1400 at addresses "0x000" to "0x00F" are allowed to access the memory element 1400 at addresses "0x100" to "0x1FF" to reach only the data ranges of "0x1" to "0x2". In this instance, the command specified as "ALLOCD MEM 100 1FF 0 F 1 2" is entered.

When a resource specified by the "ALLOCD-command" is the register 1401, then the command "ALLOCD REG <REG-NAME> <SPC> <EPC> <MIN> <MAX>" is entered. <REG-NAME> is a register classification for practicing the resource access analysis. The register classification <REGNAME> is specified by register names (REG0, REG1). <SPC>, <EPC>, <MIN>, and <MAX> are similar to those used when the specified resource is the memory.

The "LOADALLOCD-command" is entered as "LOAD-ALLOCD <file>", thereby reading the resource information, PC-information, and data ranges for practicing the data access analysis from an allocation file specified by the filename "<file>, in order to set the read data.

Figure 16:
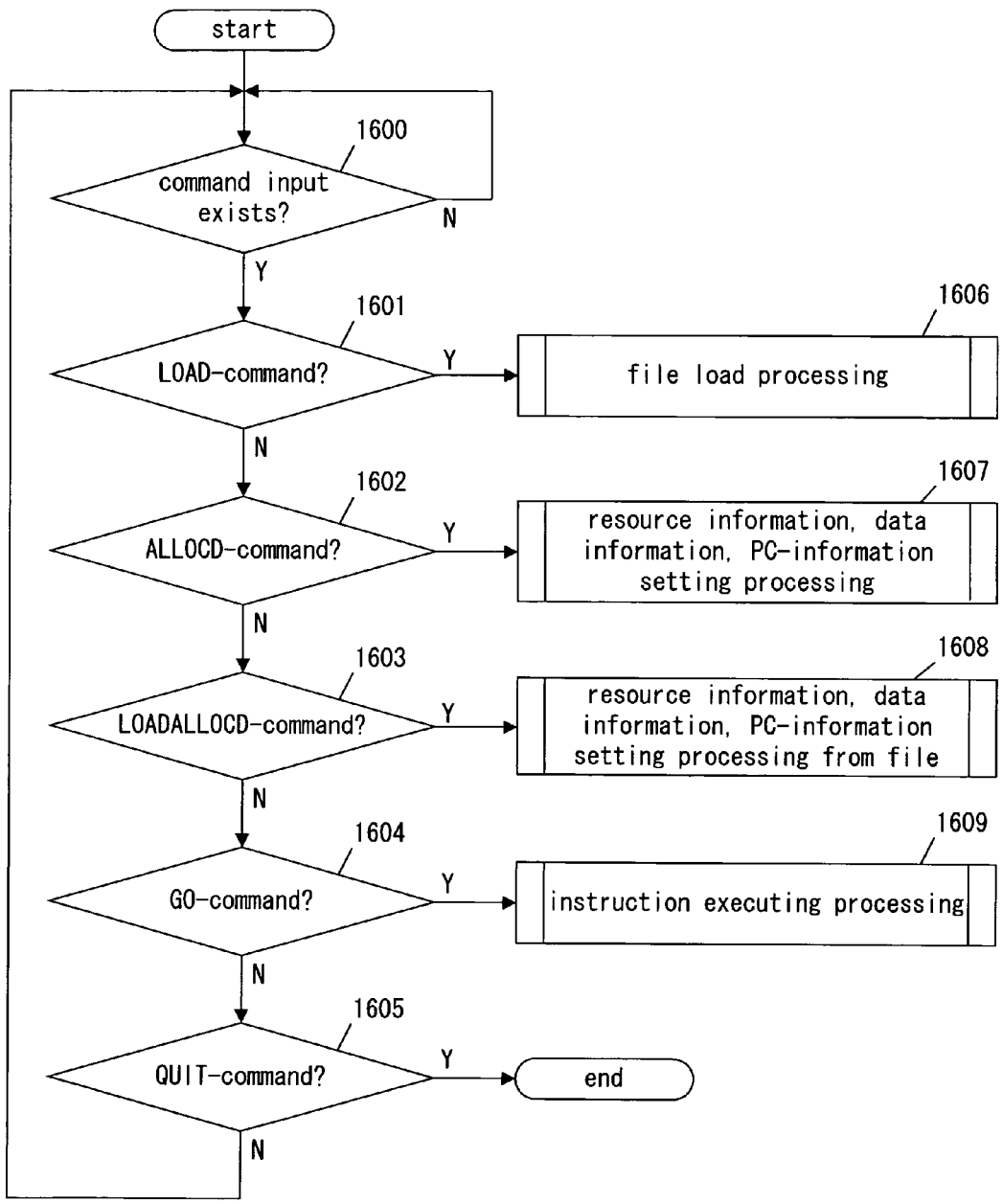
FIG. 16 is a flowchart illustrating a command input unit according to the second embodiment.

FIG. 16 illustrates a flow of processing in the command input unit 1411 of FIG. 14.

The command input unit 1411 responds to the five different commands (e.g., "LOAD") of FIG. 15.

As illustrated in FIG. 16, when the simulator is activated, then at step 1600, the simulator is ready to wait for the commands to enter. When one of the commands is entered, then at steps 1601 to 1605, different courses of actions are provided, depending upon the entered command.

When the entered commands are the "LOAD-command", "GO-command", "QUIT-command", then they are processed in a manner similar to that according to the previous embodiment.

When the entered command is the "ALLOCD-command", then the routine is advanced from step 1602 to step 1607.

Figure 17:
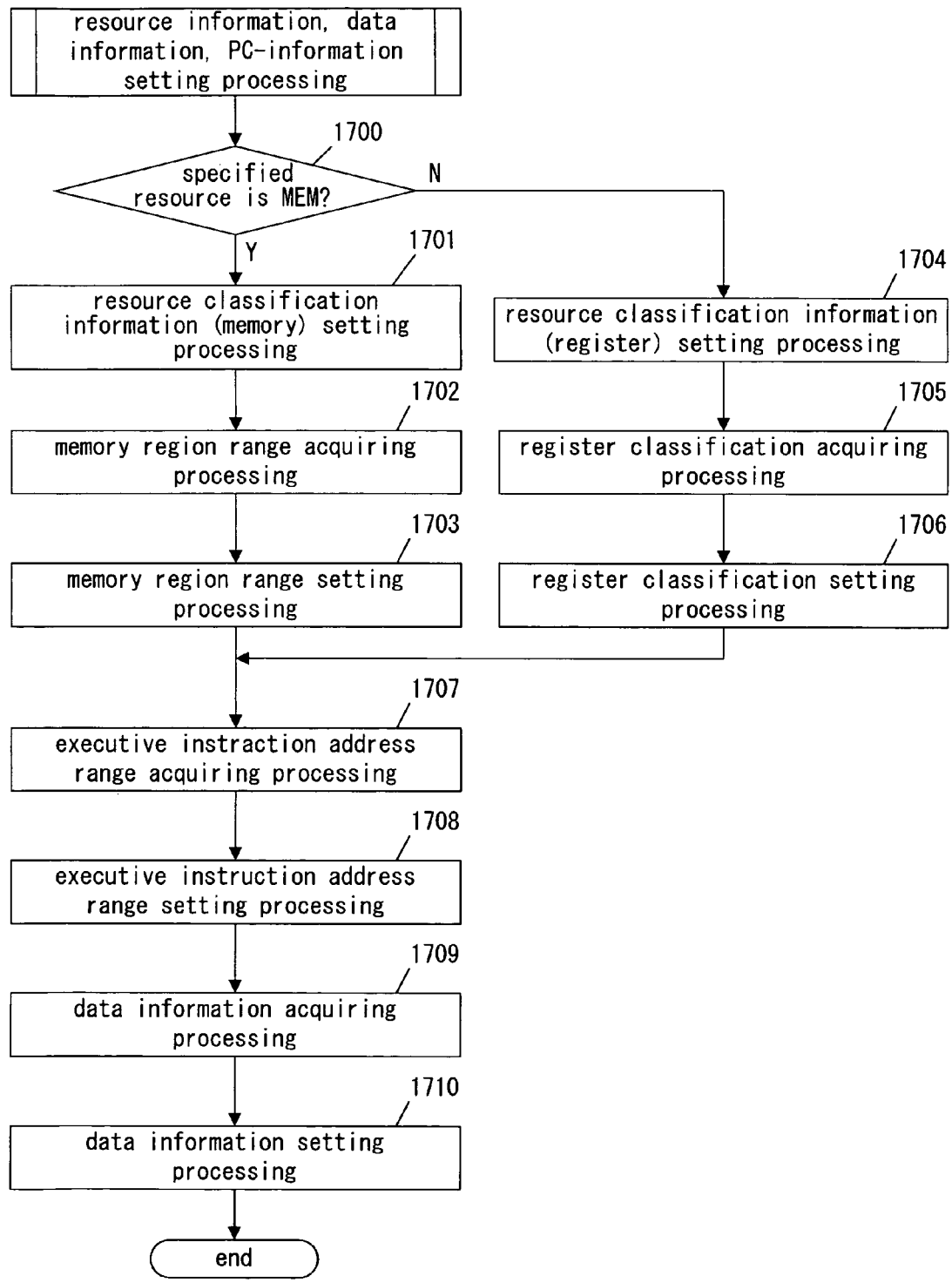
FIG. 17 is a flowchart illustrating details of step 1607 according to the second embodiment.

The following discusses details of step 1607 with reference to FIG. 17. FIG. 17 illustrates a flow of processing at step 1607.

In the present processing, at step 1700, a determination is made as to whether or not a resource specified by the "ALLOCD-command" is either the memory (MEM) or the register (REG). When the resource specified by the "ALLOCD-command" is the memory (MEM), then the routine is advanced to step 1701.

At step 1701, a resource classification (memory) is placed into an allocation information table.

Figure 18:
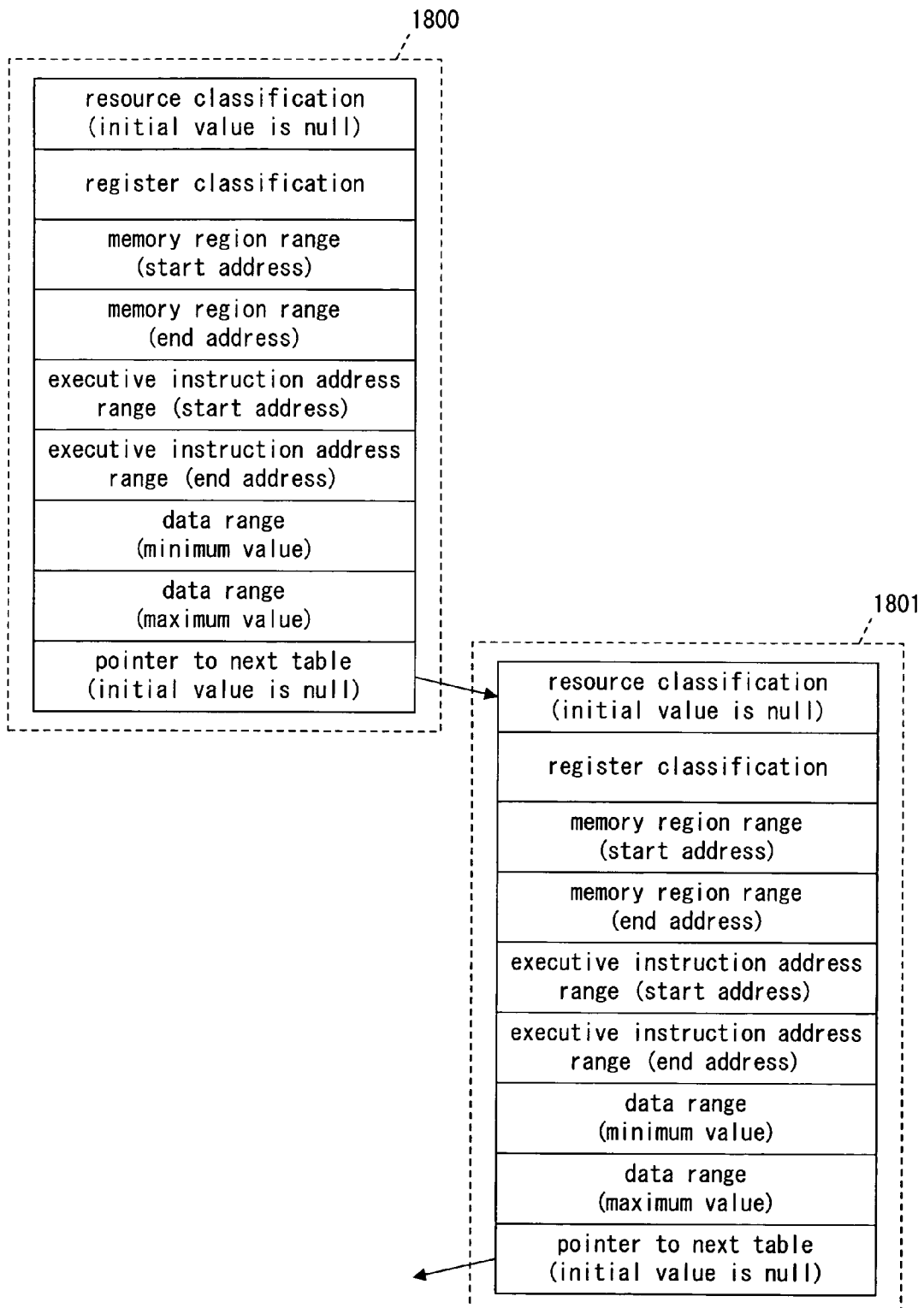
FIG. 18 is a descriptive illustration showing an allocation information table according to the second embodiment.

The following discusses the allocation information table with reference to FIG. 18. FIG. 18 is a descriptive illustration showing the allocation information table according to the present embodiment.

The allocation information table 1800 includes elements that follows: "resource classification"; "register classification"; "memory region range (start address)"; "memory region range (end address)"; "executive instruction address range (start address)"; "executive instruction address range (end address)"; "data range (minimum value)"; "data range (maximum value)"; and "pointer to the next table".

The "resource classification" element contains a resource classification specified by either "ALLOCD-command" or "LOADALLOCD-command". The latter command is discussed later. The resource classification is "0" for the memory (MEM), but is "1" for the register (REG).

The "register classification" element contains a register classification that is specified by either "ALLOCD-command" or "LOADALLOCD-command" (discussed later) when the resource classification is the register (REG). The register classification is "0" for REG0, but is "1" for REG1.

In the "memory region range (start address)" element and the "memory region rang (end address)" element, a memory region range (start address) specified by either "ALLOCD-command" or "LOADALLOCD-command" (discussed later), and a memory region rang (end address) specified thereby are set when the resource classification is the memory (MEM).

In the "executive instruction address range (start address)" element and the "executive instruction address range (end address)" element, an executive instruction address range (start address) specified by either "ALLOCD-command" or "LOADALLOCD-command" (discussed later), and an executive instruction address range (end address) specified thereby are set.

The "data range (minimum value)" element and the "data range (maximum value)" element contain data ranges (minimum value, maximum value) to be permitted during access to the resource specified by either "ALLOCD-command" or "LOADALLOCD-command" (discussed later).

In the "pointer to the next table" element, a pointer to the next table is set when several pieces of allocation information are specified by either several "ALLOCD-commands" or several "LOADALLOCD-commands" (discussed later). In the "pointer to the next table", an initial value is null. The present allocation information table is disposed in the data information storage unit 1403.

Referring back to FIG. 17, at step 1702, the memory region range (start address) specified by the "ALLOCD-command" and the memory region range (end address) specified thereby are obtained.

At step 1703, the memory region range (start address) and memory region range (end address) obtained at the previous step 1702 are set in the allocation information table.

At step 1700, when a resource specified by the "ALLOCD-command" is the register (REG), then the routine is advanced to step 1704.

At step 1704, a resource classification (register) is placed into the allocation information table.

At step 1705, register classifications (REG0, REG1) specified by the "ALLOCD-command" are obtained.

At step 1706, the register classifications obtained at the previous step 1705 are set in the allocation information table.

At step 1707, an executive instruction address range (start address) specified by the "ALLOCD-command" and an executive instruction address range (end address) specified thereby are obtained.

At step 1708, the executive instruction address range (start address) and executive instruction address range (end address) obtained at the previous step 1707 are set in the allocation information table.

At step 1709, data ranges (maximum value, minimum value) specified by the "ALLOCD-command" are obtained.

At step 1710, the data ranges (maximum value, minimum value) obtained at the previous step 1709 are set in the allocation information table. The routine is terminated.

Referring back to FIG. 16, when the entered command is the "LOADALLOCD-command", then the routine is advanced from step 1603 to step 1608.

Figure 19:
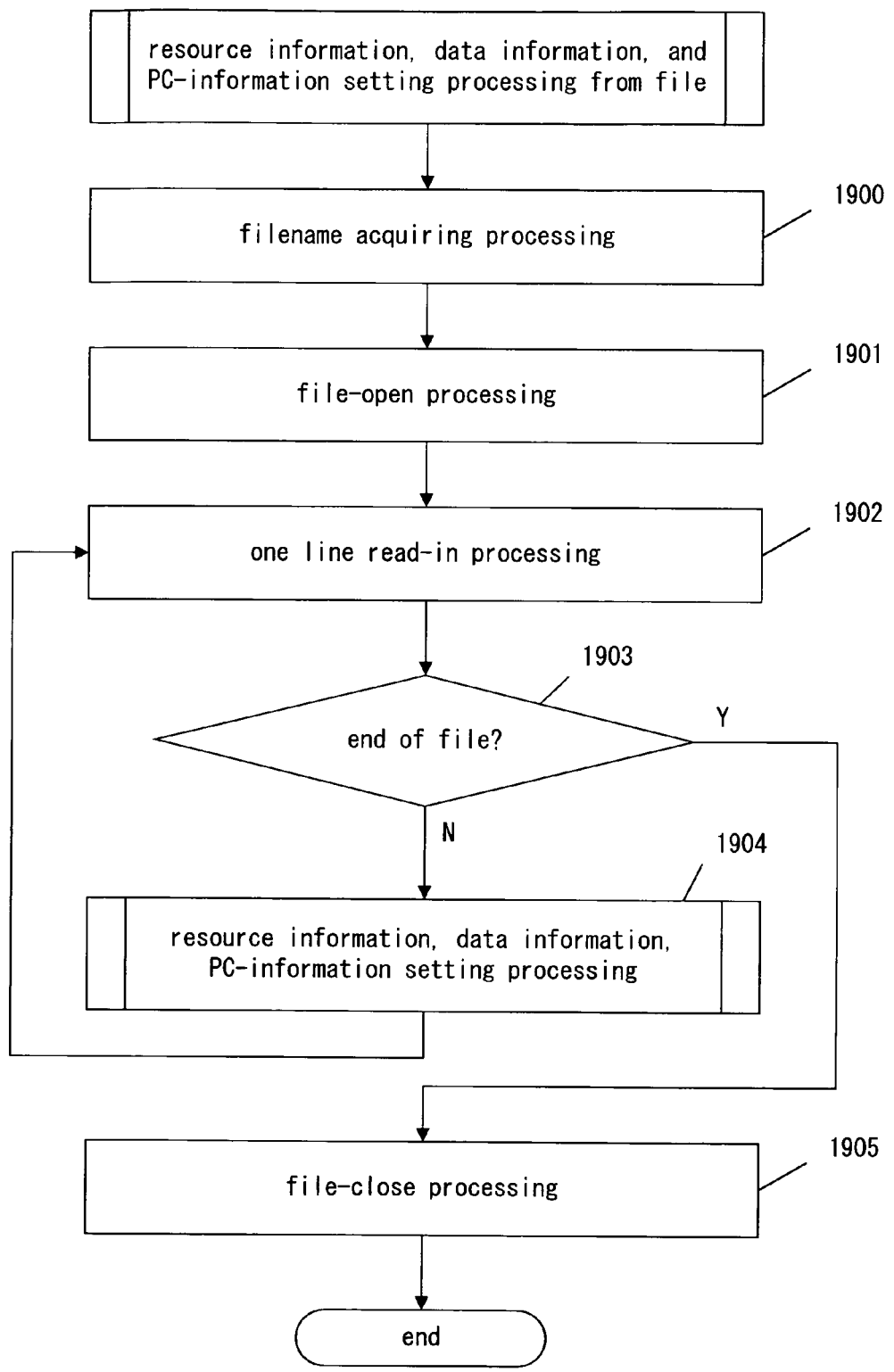
FIG. 19 is a flowchart showing details of step 1608 according to the second embodiment.

The following discusses details of step 1608 with reference to FIG. 19. FIG. 19 illustrates a flow of processing at step 1608.

In the present processing, at step 1900, an allocation filename specified by the LOADALLOCD-command" is obtained.

At step 1901, the allocation file obtained at the previous step 1900 is opened in a readable manner.

Figure 20:
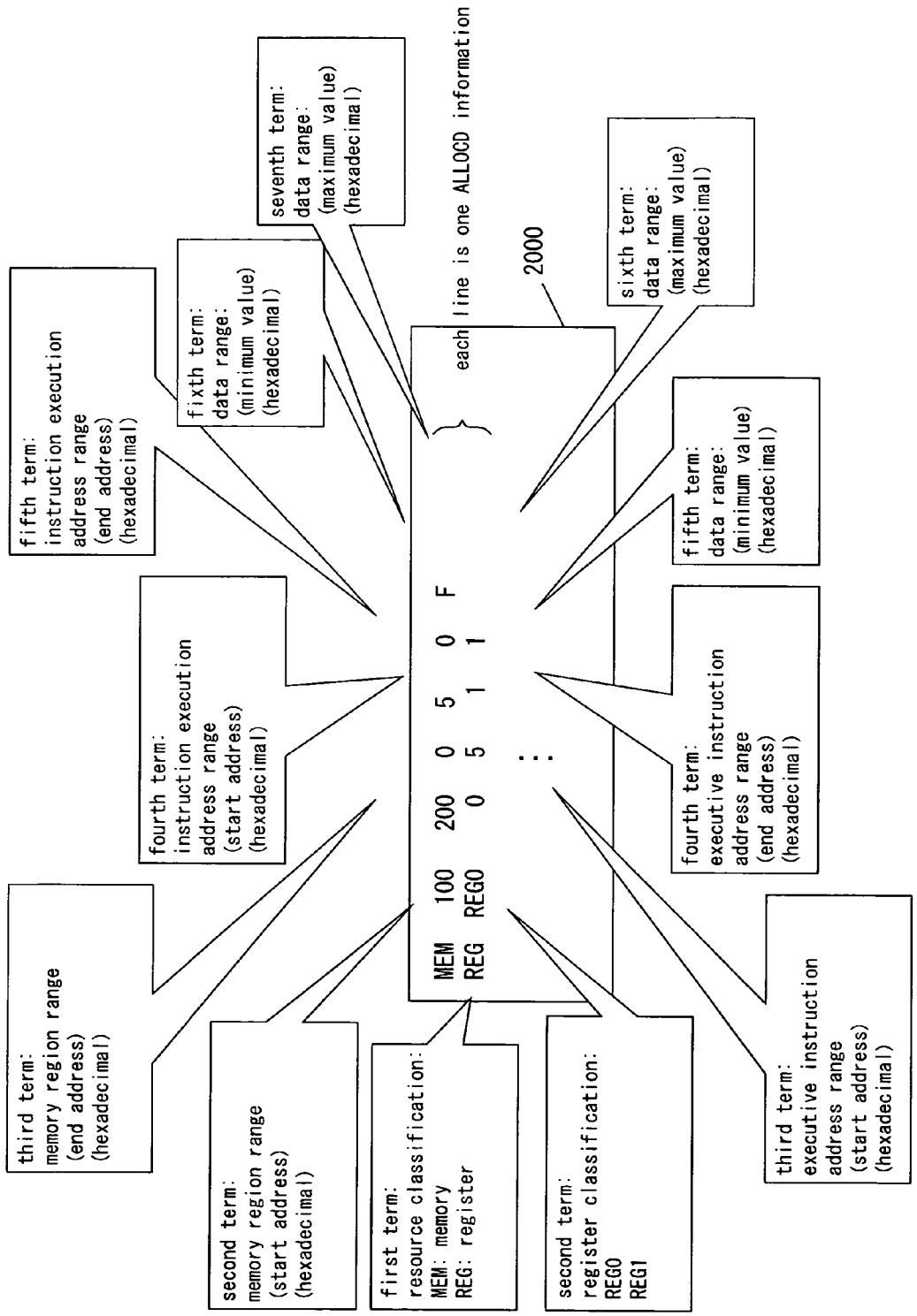
FIG. 20 is a descriptive illustration showing an allocation file according to the second embodiment.

The following discusses the allocation file with reference to FIG. 20. FIG. 20 is a descriptive illustration showing the allocation file according to the present embodiment.

In the present embodiment, the allocation file 2000 is assumed to be text data. In the allocation file 2000, each line includes a piece of allocation information, i.e., a resource classification, memory region ranges (start address, end address), a register classification, executive instruction address ranges (start address, end address), and data ranges (minimum value, maximum value).

In each of the lines, the "resource classification" is given at the leftmost end thereof (first term). In the present embodiment, assume that the "resource classification" is "MEM" when the specified resource is a memory, but that the "resource classification" is "REG" when the specified resource is a register. Subsequent settings differ, depending upon whether or not the resource classification is either the memory (MEM) or the register (REG). Each of the settings (x-th term) is separated by one or greater separator (or space according to the present embodiment).

The following discusses the settings when the resource classification is the memory (MEM). At second and third terms next to the "resource classification" on the right side thereof, the "memory region range (start address)" and "memory region range (end address)" for performing a resource access analysis are consecutively specified in hexadecimal numeral.

At fourth and fifth terms next to the "memory region range (end address)" on the right side thereof, the "executive instruction address range (start address) and "executive instruction address range (end address)" for practicing the resource access analysis are consecutively specified in hexadecimal numeral.

At sixth and seventh terms next to the "executive instruction address range (end address)" on the right side thereof, the "data range (minimum value)" and "data range (maximum value)" to permit access to memory regions specified by the memory region ranges (start address, end address) are consecutively specified in hexadecimal numeral.

The following discusses the settings when the resource classification is the register (REG). A second term next to the "resource classification" on the right side thereof is a register classification specified by register names (REG0, REG1) for practicing the resource access analysis.

At third and fourth terms next to the "register classification" on the right side thereof, the "executive instruction address range (start address) and "executive instruction address range (end address)" for practicing the resource access analysis are consecutively specified in hexadecimal numeral.

At fifth and sixth terms next to the "executive instruction address range (end address)" on the right side thereof, the "data range (minimum value)" and "data range (maximum value)" to permit access to the register specified by the register classification are consecutively specified in hexadecimal numeral.

Although the allocation file 2000 according to the present embodiment is text data, binary data instead of the text data may be used without any problem. Each of the settings described in the allocation file 2000 is changeable in format.

Referring back to FIG. 19, at step 1902, a line of data is read from the file opened at file-opening step 1901. This means that "MEM 100 200 0 5 0 F" is read from the allocation file 2000 of FIG. 20.

At step 1903, when the end of the file is reached at step 1902, then the routine is branched off to step 1905.

The routine is advanced to step 1904. At step 1904, the allocation information obtained at step 1902 is placed into the allocation information table. The allocation information is treated in the same manner as that at step 1607.

Step 1902 to step 1904 are repeated until the end of the file is reached. When the end of the file is reached, then at step 1905, the allocation file opened at step 1901 is closed, and the routine is terminated.

While instructions are executed in response to the "GO-command", the data access-analyzing unit 1404 checks the resources to determine how they are accessed, on the basis of the allocation information specified in the allocation information table by the "ALLOCD-command" and "LOADAL-LOCD-command".

Figure 21:
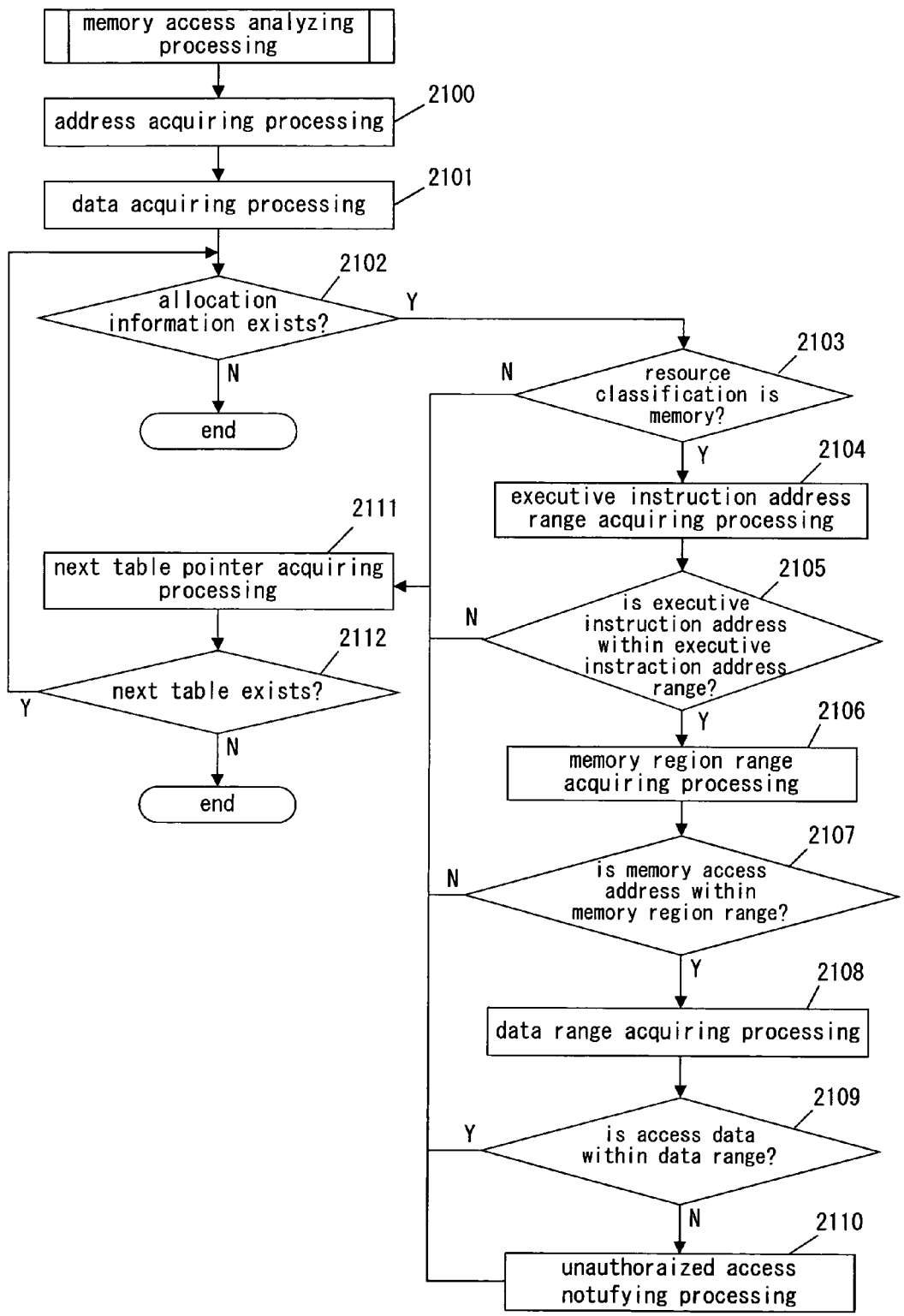
FIG. 21 is a flowchart illustrating details of step 1103 according to the second embodiment.
Figure 22:
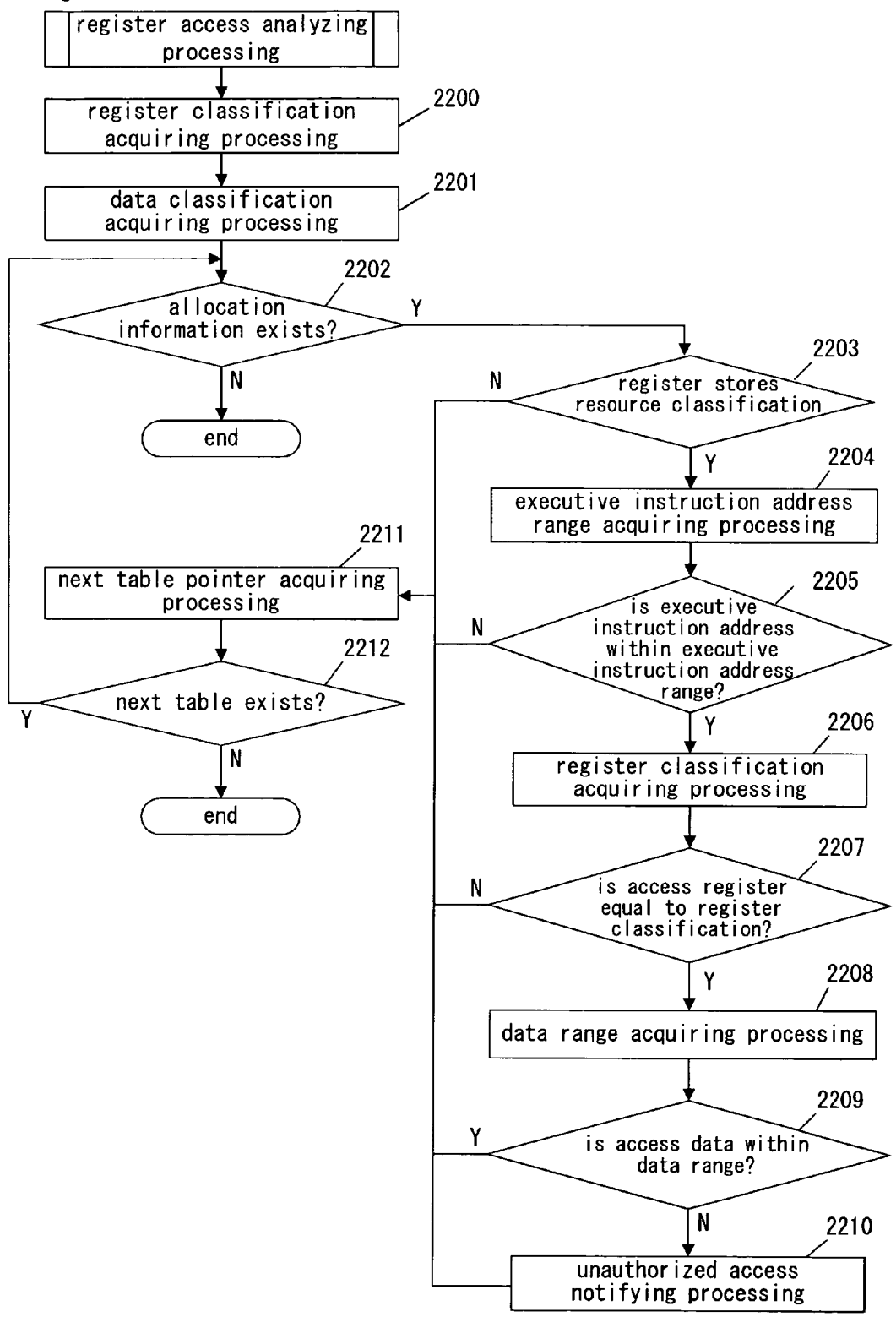
FIG. 22 is a flowchart illustrating details of step 1104 according to the second embodiment.

The following discusses details of the data access-analyzing unit 1404 with reference to FIG. 11 and FIGS. 21 and 22. FIG. 11 illustrates a flow of processing in the data access-analyzing unit 1404 of FIG. 14.

In the present processing, at step 1100, the data access-analyzing unit 1404 obtains an address of instructions currently executed by the control element 1402.

At step 1101, the data access-analyzing unit 1404 determines whether or not the executive instructions provide access to the memory element 1400 (whether or not the enable line 1412 is operative). When the answer to the determination in step 1101 results in "YES", the routine is advanced to step 1103.

The following discusses details of step 1103 with reference to FIG. 21. FIG. 21 illustrates a flow of processing at step 1103.

In the present processing, at step 1200, the data access-analyzing unit 1404 checks up on the address line 1405 to obtain an address in the memory element 1400, to which the executive instructions provide access.

At step 1201, the resource access-analyzing unit 1404 checks up on the data line 1406 to obtain data that is available when the executive instructions provide access.

At step 1202, the resource access-analyzing unit 1404 checks the allocation information table in the resource information storage unit 1403 to determine whether or not the allocation information is set in the allocation information table.

More specifically, the resource access-analyzing unit 1404 determines that the allocation information is absent, when the "resource classification" element in the allocation information table is null, but otherwise the resource access-analyzing unit 1404 determines that the allocation information is present. When it is determined at step 2102 that the allocation information is absent, then the routine is terminated. When it is determined at step 2102 that the allocation information is present, then the routine is advanced to step 2103.

At step 2103, the data access-analyzing unit 1404 determines whether or not the "resource classification" element in the allocation information table is set to be the memory (MEM). When the answer to the determination in step 2103 results in "NO", then the routine is branched off to step 2111, but otherwise the routine is advanced to step 2104.

When it is determined at step 2103 that the "resource classification" element is the memory (MEM), then at step 2104, the data access-analyzing unit 1404 obtains executive instruction address ranges from the allocation information table at the "executive instruction address range (start address)" element and at the "executive instruction address range (end address)" element.

At step 2105, the data address-analyzing unit 1404 determines whether or not the executive instruction address ranges obtained at the previous step 1204 include the executive instruction address obtained at step 1100. When the answer to the determination in step 2105 results in "NO", then the routine is branched off to step 2111, but otherwise the routine is advanced to step 2106.

When the answer to the determination in step 2105 results in "YES", then at step 2106, the data access-analyzing unit 1404 obtain memory region ranges from the allocation information table at the "memory region range (start address)" element and at the "memory region range (end address)" element.

At step 2107, the data access-analyzing unit 1404 determines whether or not the memory region ranges obtained at step 2106 include the address obtained at step 2100, to which the executive instructions provide access. When the answer to the determination in step 2107 results in "NO", then the routine is branched off to step 2111, but otherwise the routine is advanced to step 2108.

When the answer to the determination in step 2107 results in "YES", then at step 2108, the data access-analyzing unit 1404 obtains data range information from the allocation information table at the "data range (minimum value)" element and at the "data range (maximum value)" element.

At step 2109, the data access-analyzing unit 1404 determines whether or not the data ranges obtained at step 2108 include the data obtained at step 2101, to which the executive instructions provide access. When the answer to the determination in step 2109 results in "YES", then the routine is branched off to step 2111, but otherwise the routine is advanced to step 2110.

When the answer to the determination in step 2109 results in "NO", then at step 2110, the data access-analyzing unit 1404 notifies software developers of the occurrence of unauthorized access to the resource on the basis of the allocation information. The notification may be made in any way, but may be, e.g., displayed on an output apparatus such as a display (not shown).

At step 2111, the data access-analyzing unit 1404 obtains a pointer to the next allocation information table from the allocation information table at the "pointer to the next table" element.

At step 2112, the data access-analyzing unit 1404 determines whether or not a further allocation information table is present. More specifically, the data access-analyzing unit 1404 determines that the next allocation information table is absent, when the "pointer to the next table" in the allocation information table is null, but otherwise the data access-analyzing unit 1404 determines that the next allocation information table is present. When it is determined at step 2112 that the next allocation information table exists, then the routine is returned to step 2102, but otherwise the routine is terminated.

Referring back to FIG. 11, at step 1102, the data access-analyzing unit 1404 determines whether or not the executive instructions provide access to the register element 101 (whether or not the enable line 1413 is operative). When the answer to the determination in step 1102 results in "YES", the routine is advanced to step 1104.

The following discusses details of step 1104 with reference to FIG. 22. FIG. 22 illustrates a flow of processing at step 1104.

In the present processing, at initial step 2200, the data access-analyzing unit 1404 checks up on the selection line 1408 to obtain a register classification from the register element 1401, to which the executive instructions provide access.

At step 2201, the data access-analyzing unit 1404 checks up on the data line 1409 to obtain data that is available when the executive instructions provide access.

At step 2202, the data access-analyzing unit 1404 checks the allocation information table in the data information storage unit 1403 to determine whether or not allocation information is set in the allocation information table.

More specifically, the data access-analyzing unit 1404 determines that the allocation information is absent, when the "resource information" element in the allocation information table is null, but otherwise the data access-analyzing unit 1404 determines that the allocation information is present. When it is determined at step 2202 that the allocation information is absent, then the routine is terminated, but otherwise the routine is advanced to step 2203.

At step 2203, the data access-analyzing unit 1404 determines whether or not the "resource classification" element in the allocation information table is set as the register (REG). When the answer to the determination in step 2203 results in "NO", then the routine is branched off to step 2211, but otherwise the routine is advanced to step 2204.

When it is determined at step 2203 that the "resource classification" element is the register (REG), then at step 2204, the data access-analyzing unit 1404 obtains executive instruction address ranges from the allocation information table at the "executive instruction address range (start address)" element and at the "executive instruction address range (end address)" element.

At step 2205, the data access-analyzing unit 1404 determines whether or not the executive instruction address ranges obtained at the previous step 2204 include the executive instruction address obtained at step 1100. When the answer to the determination in step 2205 results in "NO", then the routine is branched off to step 2211, but otherwise the routine is advanced to step 2206.

When the answer to the determination in step 2205 results in "YES", then at step 2206, the data access-analyzing unit 1404 obtains a register classification from the allocation information table at the "register classification" element.

At step 2207, the data access-analyzing unit 1404 determines whether or not the register obtained at step 2200, to which the executive instructions provide access, is coincident with the register classification obtained at step 2206. When the answer to the determination in step 2207 results in "NO", then the routine is branched off to step 2211, but otherwise the routine is advanced to step 2208.

When the answer to the determination in step 2207 results in "YES", then at step 2208, the data access-analyzing unit 1404 obtains data range information from the allocation information table at the "data range (minimum value)" element and at the "data range (maximum value)" element.

At step 2209, the data access-analyzing unit 1404 determines whether or not the data ranges obtained at step 2208 include the data that is obtained at step 2201 and that is available when the executive instructions provide access. When the answer to the determination in step 2209 results in "YES", then the routine is branched off to step 2211, but otherwise the routine is advanced to step 2210.

When the answer to the determination in step 2209 results in "NO", then at step 2210, the data access-analyzing unit 1404 notifies the software developers of the occurrence of unauthorized access to the resource on the basis of the allocation information. The notification may be made in any way, but may be, e.g., displayed on an output apparatus such as a display (not shown).

At step 2211, the data access-analyzing unit 1404 obtains a pointer to the next allocation information table from the allocation information table at the "pointer to the next table" element.

At step 2212, the data access-analyzing unit 1404 determines whether or not a further allocation information table is present.

More specifically, the data access-analyzing unit 1404 determines that the next allocation information table is absent, when the "pointer to the next table" element in the allocation information table is null, but otherwise the data access-analyzing unit 1404 determines that the next allocation information table is present. When it is determined at step 2212 that the next allocation information table is present, then the routine is returned to step 2202, but otherwise the routine is terminated.

As described above, the simulator according to the present embodiment is operable to specify target allocation information in advance (e.g., executive instruction address ranges, resources to which access is permitted to provide, and data ranges (minimum value, maximum value)) to execute instructions, thereby detecting processing that violates the specified allocation information, and notifying the software developer of the detection. The practice of software development using the simulator according to the present invention allows software problems to be pinpointed with ease when unintended access to the data in the resources occurs because of the software problems. This feature achieves improved efficiency in software development.

Third Embodiment

A third embodiment is now described with reference to FIG. 11 and FIGS. 23 to 29.

Figure 23:
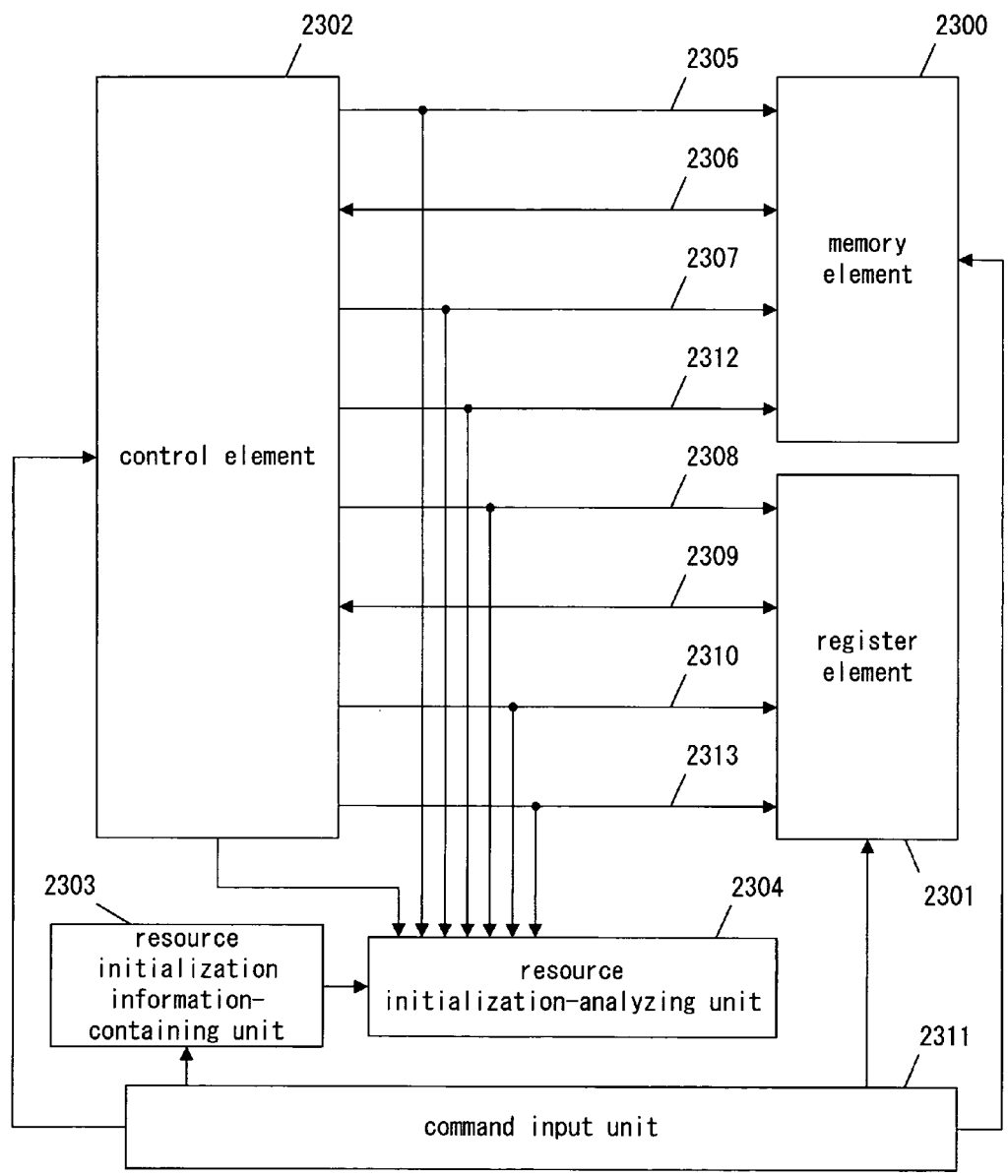
FIG. 23 is a block diagram illustrating a simulator according to a third embodiment.

FIG. 23 is a block diagram illustrating a simulator according to the present embodiment.

A memory element 2300 represents a memory that contains executive instructions issued by a processor and data treated by the processor.

A register element 2301 represents at least one register that contains data for use in calculation.

A control element 2302 represents a controller operable to read the executive instructions contained in the memory element 2300, and to access the memory element 2300 and register element 2301 in accordance with the executive instructions, thereby reading/writing the data.

The memory element 2300, register element 2301, and control element 2302 are simulated elements that represent processor- and its peripheral-forming elements.

A resource initialization information-containing unit 2303 contains information as to whether or not memory regions in the memory element 2300 and registers in the register element 2301 have been initialized.

A resource initialization-analyzing unit 2304 is operable to check the resource initialization information-containing unit 2303 to practice an analysis (resource initialization analysis) as to whether or not the memory element 2300 and register element 2301 to be accessed by the control element 2302 have been initialized.

A command input unit 2311 is operable to analyze entered commands to operate the control element 2302, memory element 2300, and register element 2301, thereby executing processing in accordance with the commands.

The control element 2302 is connected to the memory element 2300 through an address line 2305, a data line 2306, a RW-line 2307, and an enable line 2312. The address line 2305 transmits a specified address when the control element 2302 provides access to the memory element 2300. The data line 2306 sends and receives read/write data. The RW-line 2307 shows either read or write access. The enable line 2312 shows whether or not the control element 2302 is in the course of access to the memory element 2300.

Similarly, the control element 2302 is connected to the register element 2301 through a selection line 2308, a data line 2309, a RW-line 2310, and an enable line 2313. The selection line 2308 transmits a specified register classification when the control element 2302 provides access to the register element 2301. The data line 2309 sends and receives read/write data. The RW-line 2310 shows either read or write access. The enable line 2313 shows whether or not the control element 2302 is in the course of access to the register element 2301.

The above lines 2305, 2306, 2307, 2312, 2308, 2309, 2310, and 2313 are included in the simulated elements.

The simulator of FIG. 23 is realized by a gang of software modules that are run on a host processor such as a personal computer (PC) and a work station (WS).

The simulator according to the present embodiment includes a unit operable to check whether or not the memory element and register element have been initialized. The above unit includes the resource initialization information-containing unit 2303 operable to store the information that shows whether or not the memory element and register element have been initialized, and the resource initialization-analyzing unit 2304 operable to analyze, with reference to the resource initialization information-containing unit, whether or not the memory element 2300 and register element 2301 to be accessed by the control element 2302 have been initialized, when the control element provides access to the memory element and register element.

FIG. 24 is an illustration showing a list of commands to which the simulator according to the present embodiment responds. Pursuant to the present embodiment, the simulator responds to a "LOAD-command", a "GO-command", a "SET-command", and a "QUIT-command". These commands are susceptible to various changes.

The following discusses a format and function of each of the commands.

The "LOAD-command", "GO-command", "QUIT-command" are similar to those according to the first or second embodiment.

The "set-command" is used to set specified data in a specified resource (the memory or the register). When the specified resource is the memory 2300, then the command "SET MEM <ADDR> <DATA>" is entered.

<ADDR> is a memory region address to set data thereto. The address <ADDR> is specified in hexadecimal numeral. <DATA> is data to be set in the memory element 2300 at the address specified by <ADDR>. The data <DATA> is specified in hexadecimal numeral. For example, to set data 0x1 in the memory element 2300 at address 0x000, the command specified as "SET MEM 0 1" is entered.

When a resource specified by the "SET-command" is the register 2301, then the command "SET REG <REGNAME> <DATA>" is entered. <REGNAME> is a register classification to set data thereto. The register classification <REGNAME> is specified by register names (REG0, REG1). <DATA> is data similar to that used when the specified resource is the memory.

Figure 25:
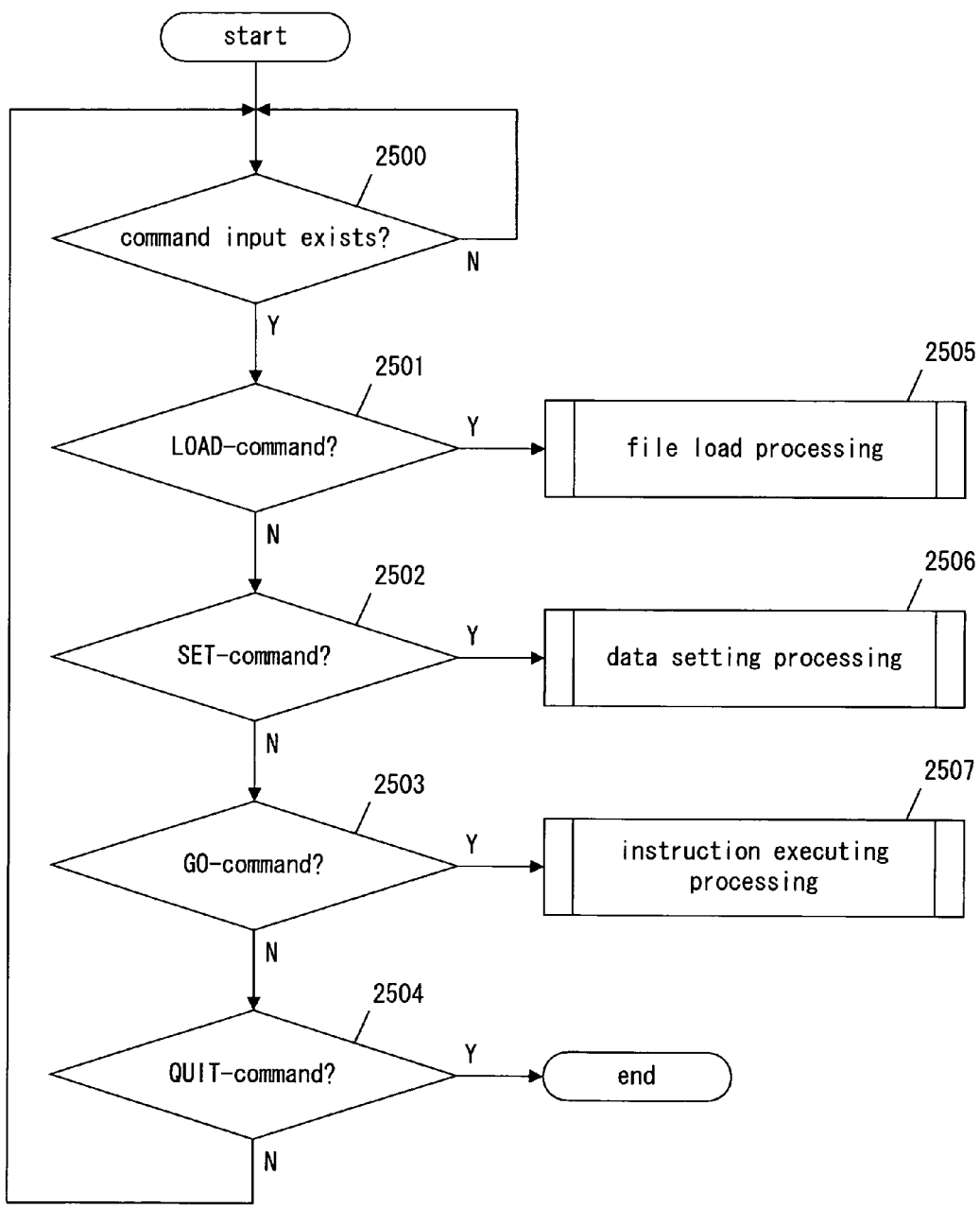
FIG. 25 is a flowchart illustrating a command input unit according to the third embodiment.

FIG. 25 illustrates a flow of processing in the command input unit 2311.

Assume that the command input unit 2311 responds to the five different commands of FIG. 24. As illustrated in FIG. 25, when the simulator is activated, then at step 2500, the simulator is ready to receive the commands. When one of the commands is entered, then different courses of actions are provided at steps 2501 to 2504, depending upon the entered command.

When the entered commands are the "LOAD-command", "GO-command", and "QUIT-command", then they are treated in a manner similar to that according to the first or second embodiment.

When the entered command is the "SET-command", then the routine is advanced from step 2502 to step 2506.

Figure 26:
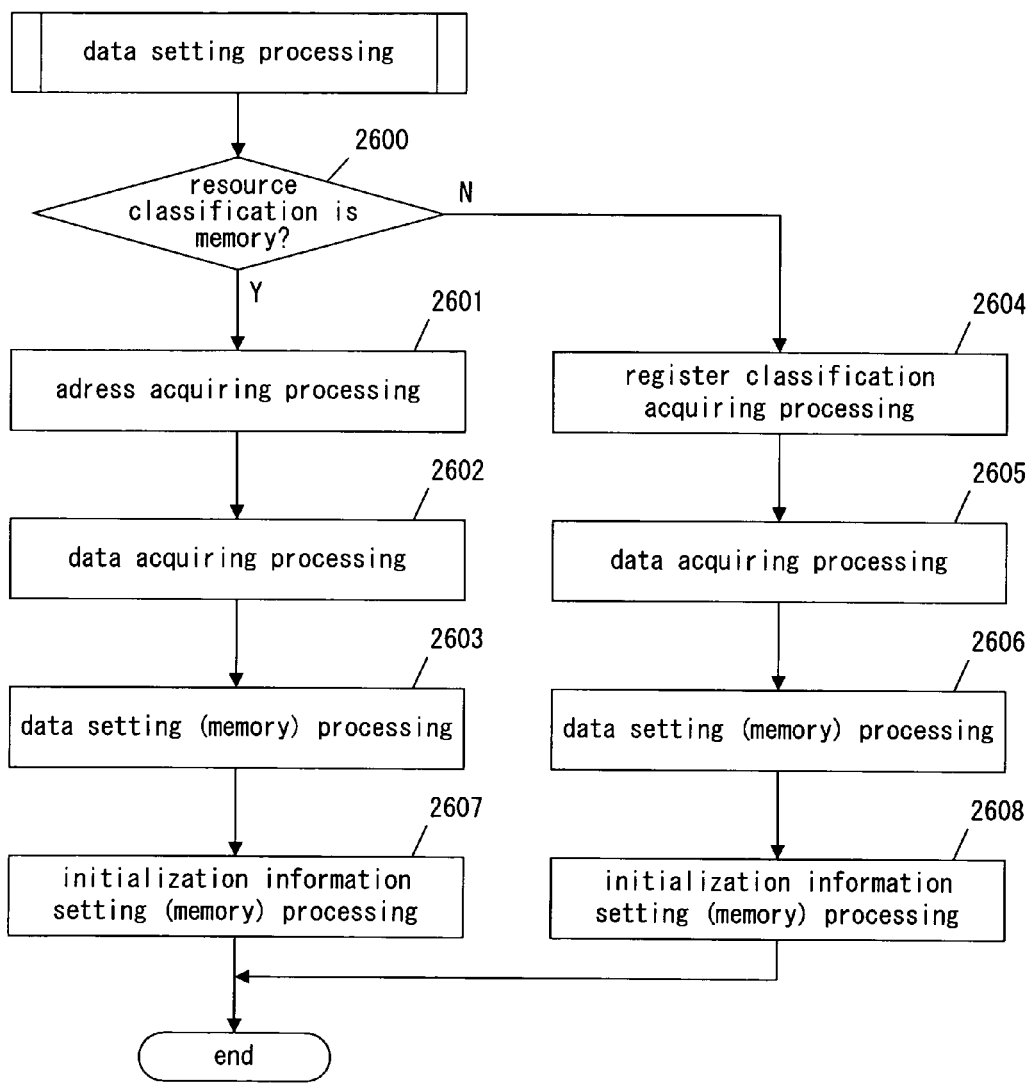
FIG. 26 is a flowchart illustrating details of step 2506 according to the third embodiment.

The following discusses details of step 2506 with reference to FIG. 26. FIG. 26 illustrates a flow of processing at step 2506.

In the present processing, at step 2600, a determination is made as to whether or not a resource classification specified by the "SET-command" is either the memory (MEM) or the register (REG). When the specified resource classification is the memory (MEM), then the routine is branched off to step 2601. When the specified resource classification is the register (REG), then the routine is branched off to step 2604.

When the resource classification is the memory (MEM), then at step 2601, information on an address is obtained, to which data specified by the "SET-command" is set.

At step 2602, the data specified by the "SET-command" is obtained.

At step 2603, the data obtained at step 2602 is set in the memory element 2300 at the address region obtained at step 2601.

At step 2607, "initialized (1)" is set in the resource initialization information-containing unit 2303 at initialization information contained in a resource initialization information table, and the routine is terminated. The initialization information is related to the memory address region obtained at step 2601. The resource initialization information table contained in the resource initialization information-containing unit 2303 is discussed later.

When the resource classification is the register (REG), then at step 2604, a register classification specified by the "SET-command" is obtained.

At step 2605, data specified by the "SET-command" is obtained.

At step 2606, the data obtained at step 2605 is set in the register element 2301 at the register obtained at step 2604.

At step 2608, "initialized (1)" is set in the resource initialization information-containing unit 2303 at initialization information in the resource initialization information table, and the routine is terminated. The initialization information is related to the register obtained at step 2604.

The resource initialization-analyzing unit 2304 checks how the resources (the memory, the register) to be accessed are initialized, during the execution of instructions in response to the "GO-command".

The following discusses details of the resource initialization-analyzing unit 2304 with reference to FIG. 11 and FIGS. 27-29. FIG. 11 illustrates a flow of processing in the resource initialization-analyzing unit 2304.

In the present processing, at executive instruction address-obtaining step 1100, the resource initialization-analyzing unit 2304 obtains an address of instructions currently executed by the control element 2302.

At step 1101, the resource initialization-analyzing unit 2304 determines whether or not the executive instructions provide access to the memory element 2300 (whether or not the enable line 2312 is operative). When the answer to the determination in step 1101 results in "YES", the routine is advanced to step 1103.

Figure 27:
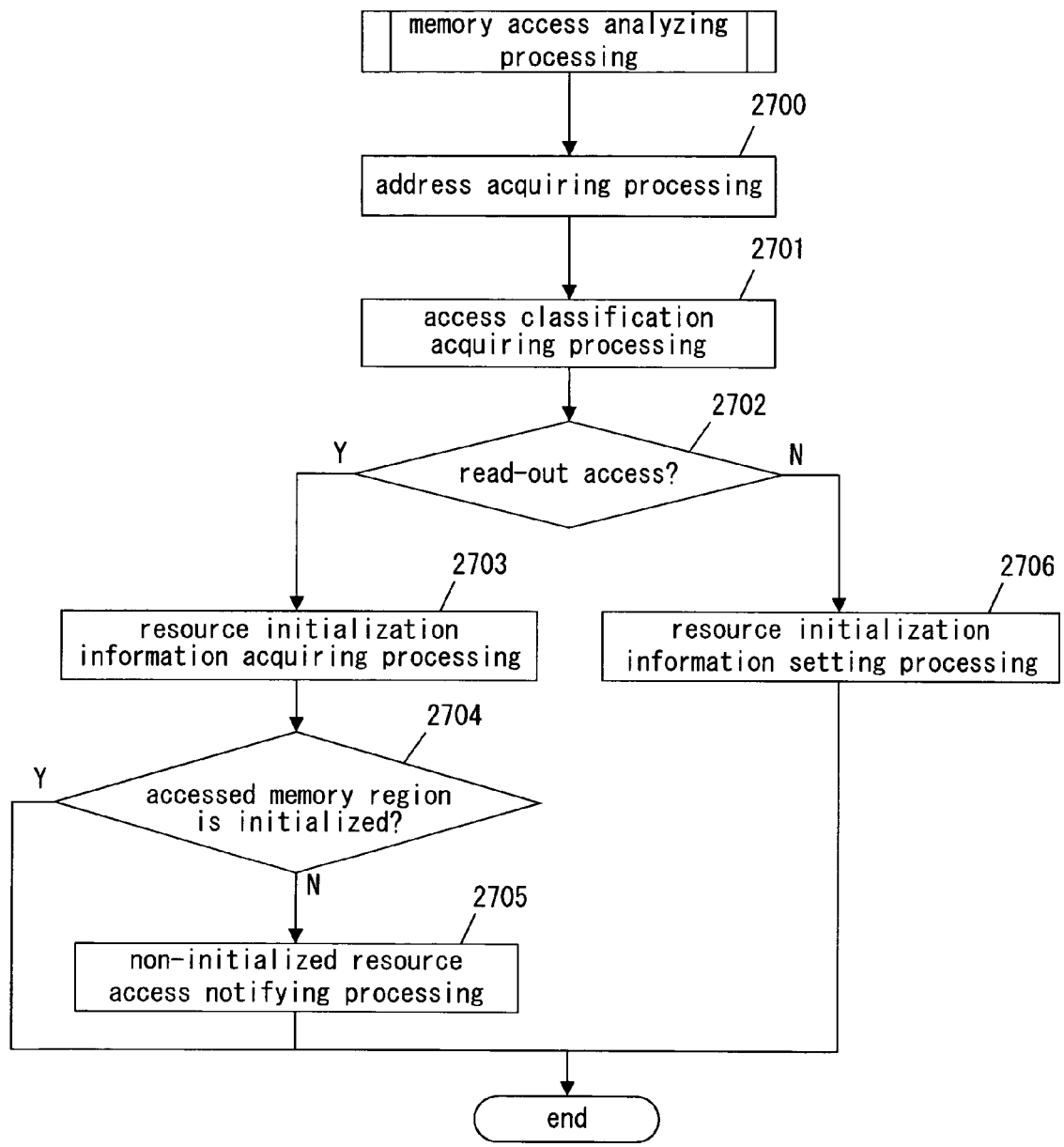
FIG. 27 is a flowchart showing details of step 1103 according to the third embodiment.

The following discusses details of step 1103 with reference to FIG. 27. FIG. 27 illustrates a flow of processing at step 1103.

In the present processing, at step 2700, the resource initialization-analyzing unit 2304 checks up on the address line 2305 to obtain an address in the memory element 2300, to which the executive instructions provide access.

At step 2701, the resource initialization-analyzing unit 2304 checks up on the RW-line 2307 to obtain an access classification (read or write) of the executive instructions.

At step 2702, the resource initialization-analyzing unit 2304 checks up on the access classification obtained at step 2701. When the access classification is read access, then the routine is branched off to step 2703. When the access classification is write access, then the routine is branched off to step 2706.

The following discusses details of the read access. At step 2703, the resource initialization-analyzing unit 2304 obtains initialization information related to the memory address obtained at step 2700, with reference to the resource initialization information table in the resource initialization information-containing unit 2303.

Figure 28:
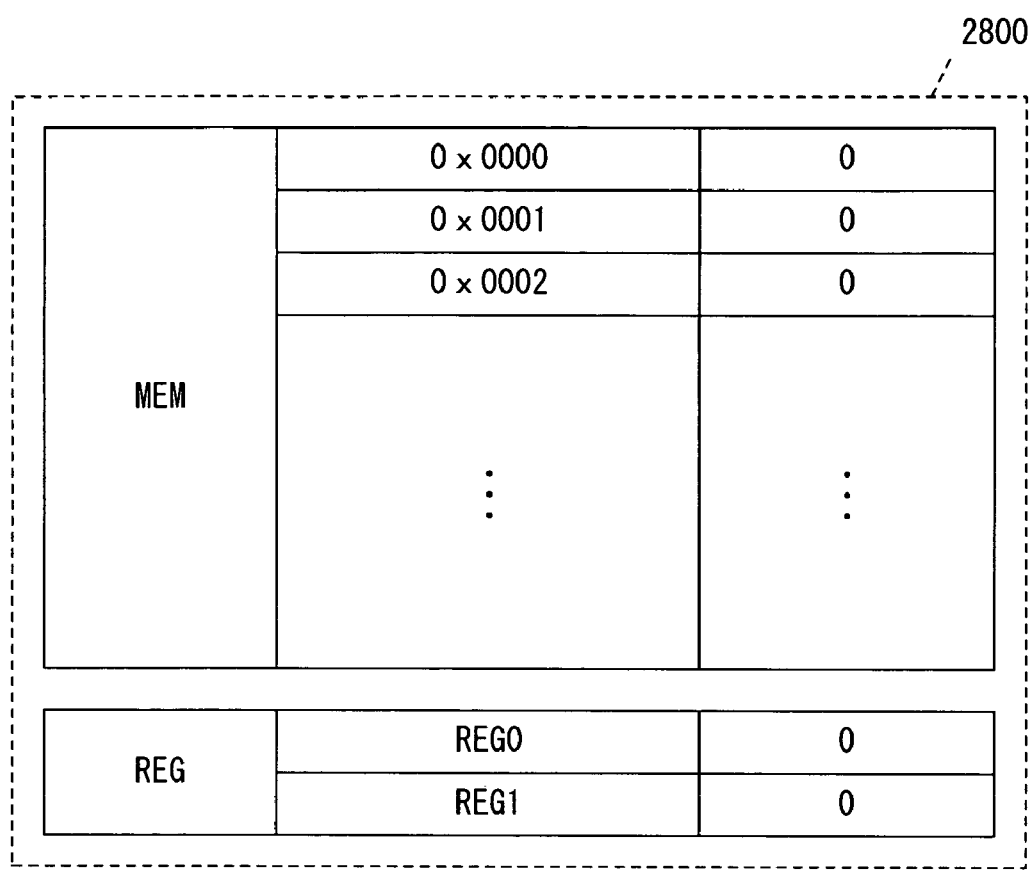
FIG. 28 is a descriptive illustration showing a resource initialization information table according to the third embodiment.

The following discusses the resource initialization information table with reference to FIG. 28. FIG. 28 is a descriptive illustration showing the resource initialization information table according to the present embodiment.

The resource initialization information table 2800 registers initialization information on the processor resources (the memory, the register) simulated by the simulator of FIG. 23.

In the first index, a resource classification (either the memory (MEM) or the register (REG)) is registered. In the second index, a memory address is registered when the resource classification is the memory (MEM), but a register name is registered when the resource classification is the register (REG). A piece of initialization information ("0" for non-initialized, and "1" for initialized) is set for each of the resources.

When the simulator is activated, then all of the resources are set as "non-initialized (0)", except for resources that are initialized to any values in hardware when the processor simulated by the simulator of FIG. 23 is switched on or otherwise reset.

To obtain (set) the initialization information on each of the resources from the resource initialization information table 2800, the first index corresponding to a specified resource classification (the memory, the register) is selected. When the resource classification is the memory, then the second index corresponding to a specified address is selected, but the second index corresponding to a specific register name is selected when the resource classification is the register. After the selection, target resource initialization information ("0" for non-initialized, "1" for initialized) is accessed.

Referring back to FIG. 27, at step 2704, the resource initialization-analyzing unit 2304 determines whether or not the initialization information obtained at step 2703 is either "non-initialized (0)" or "initialized (1)". When it is determined at step 2704 that the initialization information is "initialized (1)", then the routine is terminated. When it is determined at step 2704 that the initialization information is "non-initialized (0)", then the routine is advanced to step 2705.

When a resource to be accessed by executive instructions is "non-initialized (0)", then at step 2705, the resource initialization-analyzing unit 2304 notifies software developers of the occurrence of access to the resource that has never been initialized. The notification may be made in any way, but may be, e.g., displayed on an output apparatus such as a display (not shown).

The following discusses details of the write access. At step 2706, the resource initialization information-analyzing unit 2034 sets "initialized (1)" in the resource initialization information-containing unit 2303 at initialization information in the initialization information table, and the routine is terminated. The initialization information is related to the memory address region obtained at step 2700.

Referring back to FIG. 11, at step 1102, the resource initialization-analyzing unit 2304 determines whether or not the executive instructions provide access to the register element 2301 (whether or not the enable line 2313 is operative). When the answer to the determination in step 1102 results in "YES", the routine is advanced to step 1104.

Figure 29:
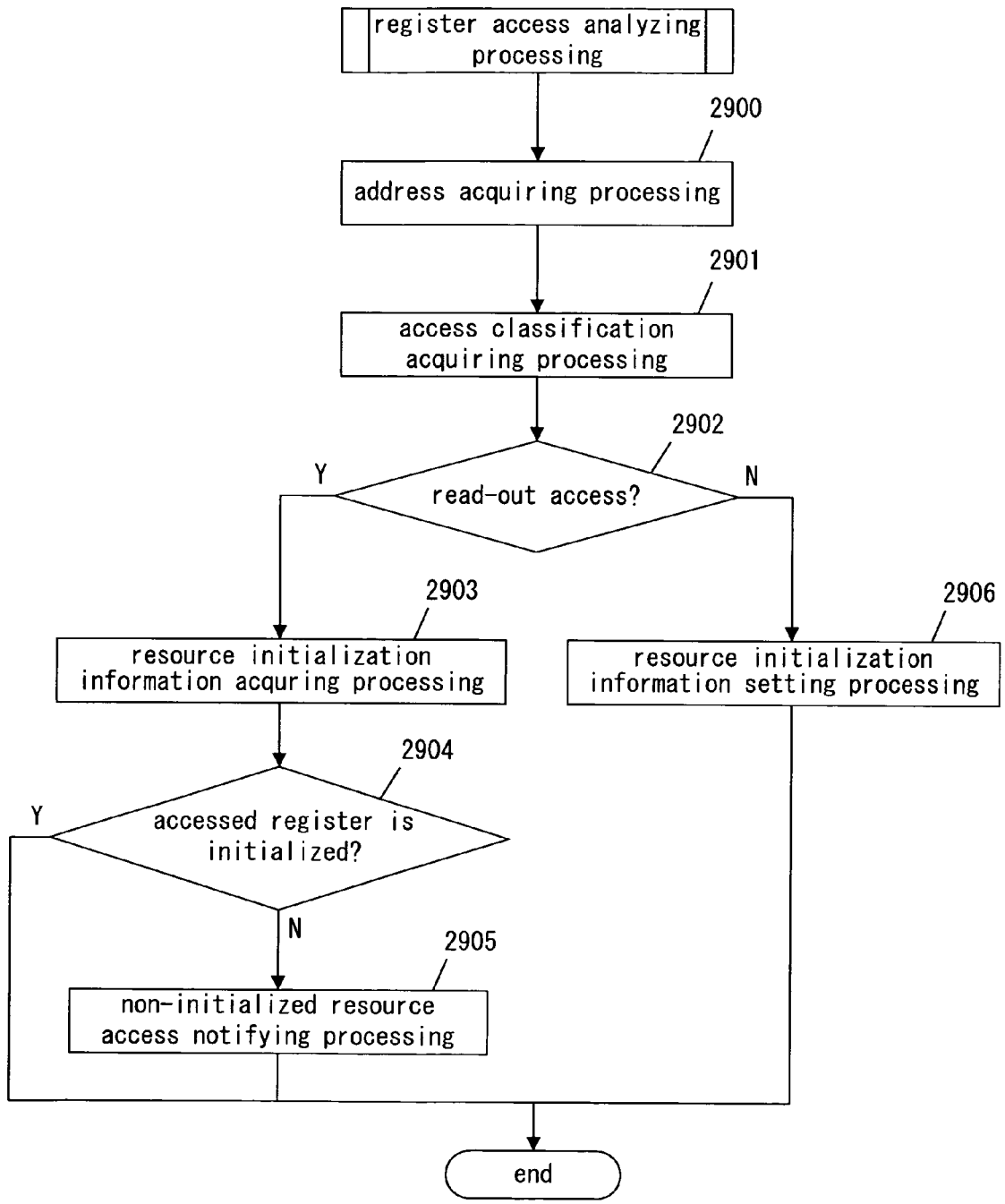
FIG. 29 is a flowchart illustrating details of step 1104 according to the third embodiment.

The following discusses details of step 1104 with reference to FIG. 29. FIG. 29 illustrates a flow of processing at step 1104.

In the present processing, at step 2900, the resource initialization-analyzing unit 2304 checks up on the selection line 2308 to obtain a register classification of the register element 2301, to which the executive instructions provide access.

At step 2901, the resource initialization-analyzing unit 2304 checks up on the RW-line 2310 to obtain an access classification (read or write) of the executive instructions.

At step 2902, the resource initialization-analyzing unit 2304 checks up on the access classification obtained at step 2901. When the access classification is read access, then the routine is branched off to step 2903. When the access classification is write access, then the routine is branched off to step 2906.

The following discusses details of the read access. At step 2903, the resource initialization-analyzing unit 2304 obtains initialization information related to the register obtained at step 2900, with reference to the resource initialization information table in the resource initialization information-containing unit 2303.

At step 2904, the resource initialization-analyzing unit 2304 determines whether or not the initialization information obtained at resource initialization information-obtaining step 2903 is either "non-initialized (0)" or "initialized (1)".

When it is determined at step 2904 that the initialization information is "initialized (1)", then the routine is terminated. When it is determined at step 2904 that the initialization information is "non-initialize (0)", then the routine is advanced to step 2905.

When a resource to be accessed by the executive instructions is "non-initialized (0)", then at step 2905, the resource initialization-analyzing unit 2304 notifies the software developers of the occurrence of access to the resource that has never been initialized. The notification may be made in any way, but may be, e.g., displayed on an output apparatus such as a display (not shown).

The following discusses details of the write access. At step 2906, the resource initialization-analyzing unit 2304 sets "initialized (1)" in the resource initialization information-containing unit 2303 at initialization information in the resource initialization information table, and the routine is terminated. The initialization information is related to the register obtained at step 2900.

As described above, the simulator according to the present embodiment provides information on whether or not the resources have been initialized, detects the occurrence of access to non-initialized resources during the execution of instructions that access the resources, and notifies the software developers of the detection. The practice of software development using the simulator according to the present invention allows software problems to be pinpointed with ease when access to the non-initialized resources occurs because of the software problems. This feature provides improved efficiency in software development.

Fourth Embodiment

A fourth embodiment is now described with reference to FIGS. 30 to 32.

Figure 30:
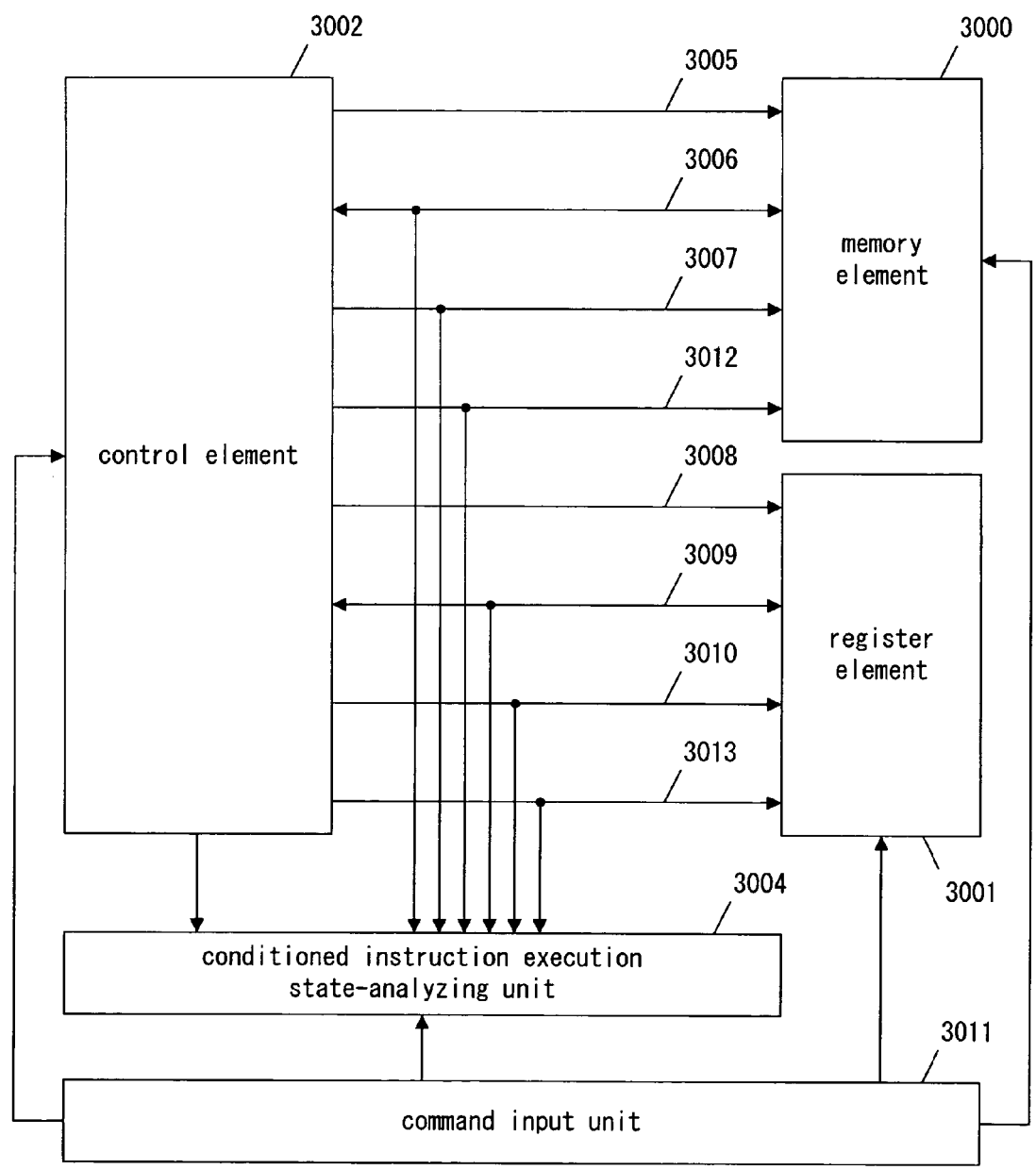
FIG. 30 is a block diagram illustrating a simulator according to a fourth embodiment.

FIG. 30 is a block diagram illustrating a simulator according to the present embodiment.

A memory element 3000 represents a memory that contains executive instructions issued by a processor and data treated by the processor.

A register element 3001 represents at least one register that contains data for use in calculation.

A control element 3002 represents a controller operable to read the executive instructions contained in the memory element 3000, to access the memory element 3000 and register element 3001 in accordance with the executive instructions, and to branch off the executive instructions (conditioned instructions), depending upon results from reference to the register in the register element 3001.

The memory element 3000, register element 3001, and control element 3002 are simulated elements that represent processor- and its peripheral-forming elements.

During the execution of the conditioned instructions that perform processing in dependence upon results from that the register in the register element 3001 is referenced by the instructions executed by the control element 3002, a conditioned instruction execution state-analyzing unit 3004 is operable to store address information on the conditioned instructions and a register value referenced during the execution of the conditioned instructions.

The command input unit 3011 is operable to analyze entered commands to operate the control element 3002, memory element 3000, and register element 3001, thereby executing processing in accordance with the commands.

The control element 3002 is connected to the memory element 3000 through an address line 3005, a data line 3006, a RW-line 3007, and an enable line 3012. The address line 3005 transmits a specified address when the control element 3002 provides access to the memory element 3000. The data line 3006 sends and receives read/write data. The RW-line 3007 shows either read or write access. The enable line 3012 shows whether or not the control element 3002 is in the course of access to the memory element 3000.

Similarly, the control element 3002 is connected to the register element 3001 through a selection line 3008, a data line 3009, a RW-line 3010, and an enable line 3013. The selection line 3008 transmits a specified register classification when the control element 3002 provides access to the register element 3001. The data line 3009 sends and receives read/write data. The RW-line 3010 shows either read or write access. The enable line 3013 shows whether or not the control element 3002 is in the course of access to the register element 3001.

The above lines 3005, 3006, 3007, 3012, 3008, 3009, 3010, and 3013 are included in the simulated elements.

The simulator of FIG. 30 is realized by a gang of software modules that are run on a host processor such as a personal computer (PC) and a work station (WS).

The simulator according to the present embodiment responds to commands of FIG. 24. A course of action during the execution of each of the commands is similar to that according to the second embodiment.

During the execution of the instructions in accordance with a "GO-command", the conditioned instruction execution state-analyzing unit 3004 stores address information on the conditioned instructions and a register value referenced during the execution of the conditioned instructions.

Figure 31:
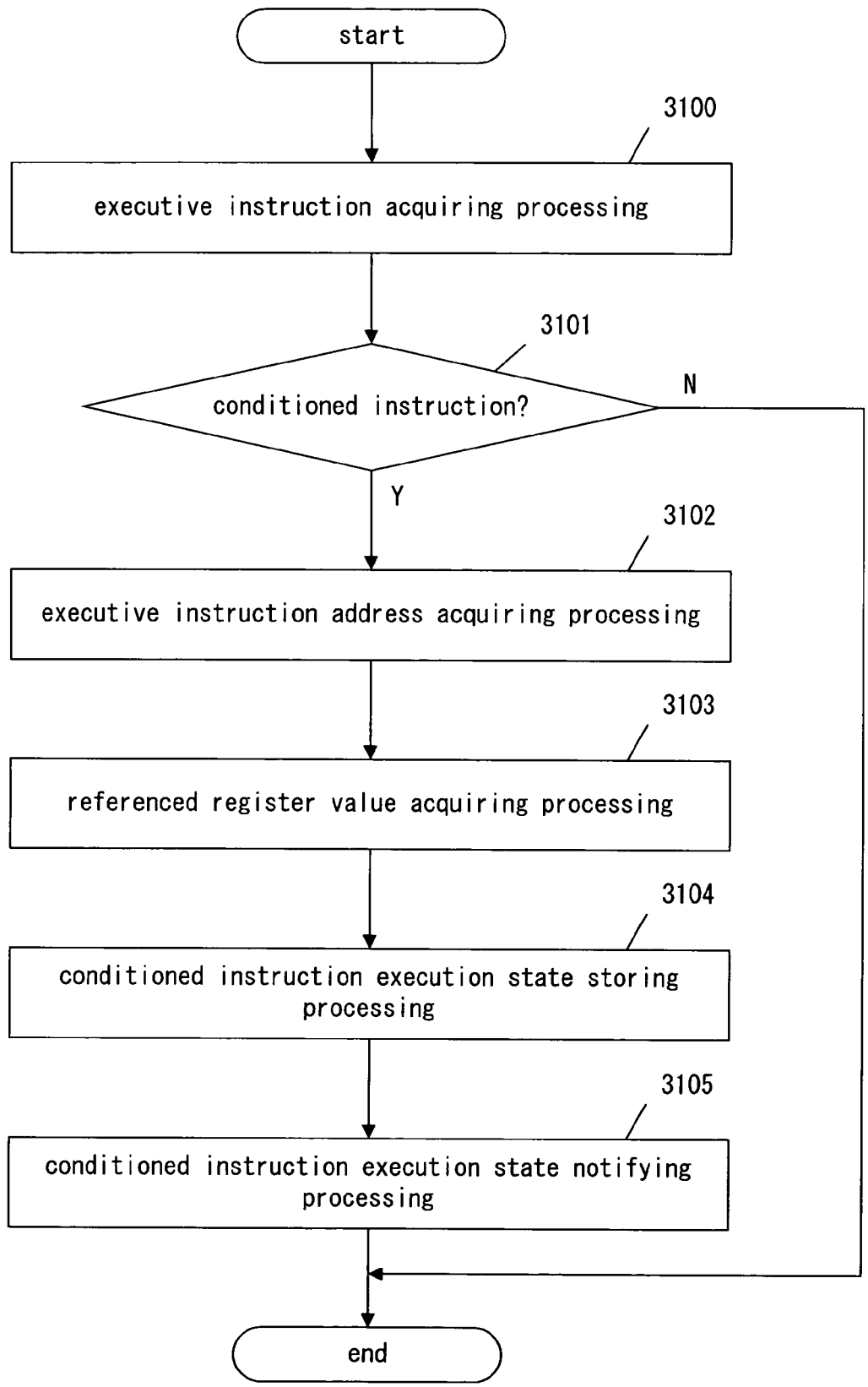
FIG. 31 is a flowchart illustrating a conditioned instruction execution state-analyzing unit according to the fourth embodiment.

The following discusses details of the conditioned instruction execution state-analyzing unit 3004 with reference to FIG. 31. FIG. 31 illustrates a flow of processing in the conditioned instruction execution state-analyzing unit 3004.

In the present processing, at step 3100, the conditioned instruction execution state-analyzing unit 3004 obtains instruction codes currently executed by the control element 3002. In the present embodiment, assume that the instruction codes are 32-bit codes as illustrated by the program file 5000 of FIG. 5. The control element 3002 executes processing according to the instruction codes.

A processor simulated by the simulator of FIG. 30 executes the conditioned instructions, i.e., steps to be taken in dependant upon the results from reference to the register in the register element 3001. Assume that the processor is operable to respond to the instructions "JP/CC" that branch off executive instructions to specified addresses in accordance with specified conditions.

Figure 32:
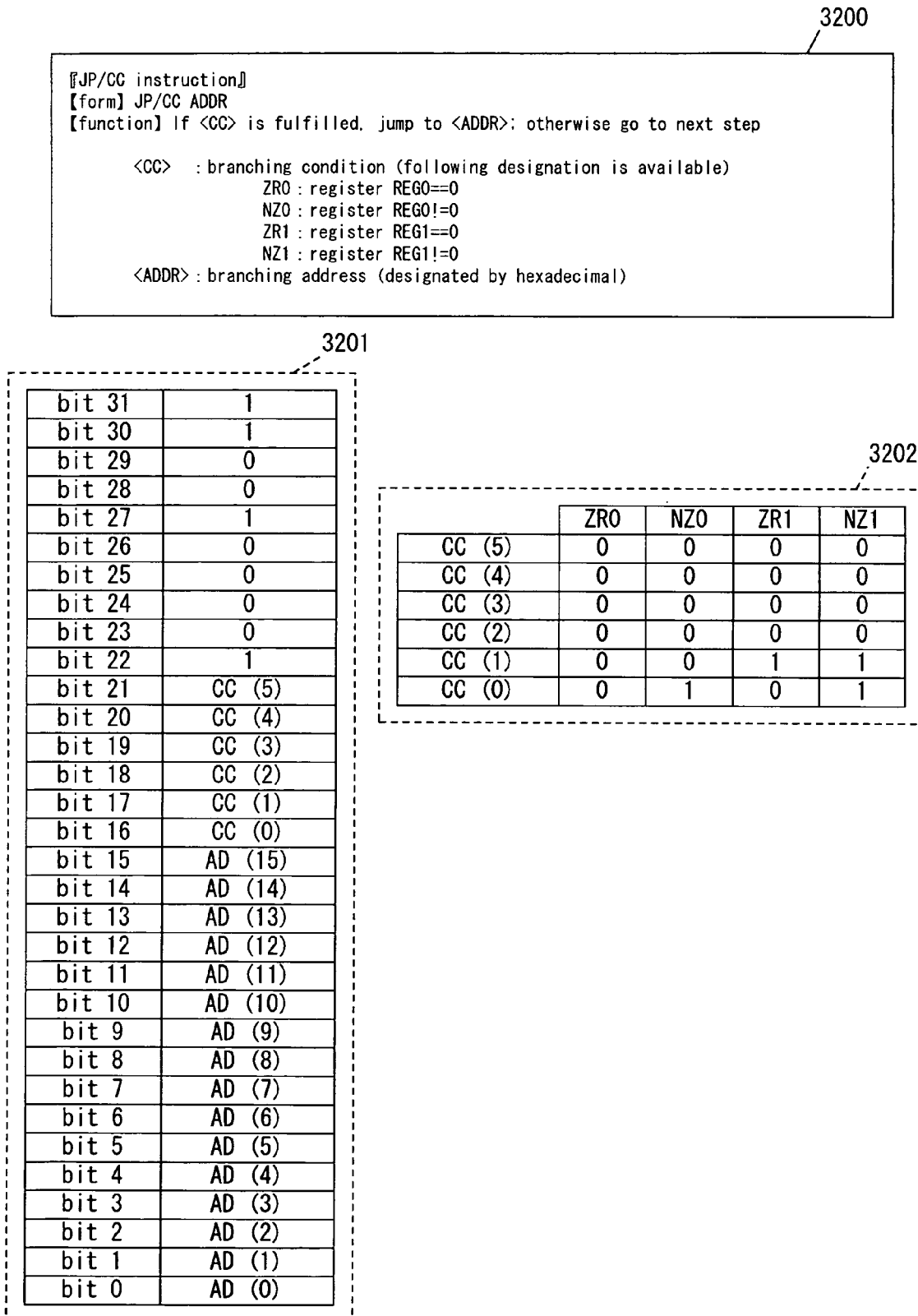
FIG. 32 is a descriptive illustration showing conditioned instructions "JP/CC" according to the fourth embodiment.
Figure 33A:
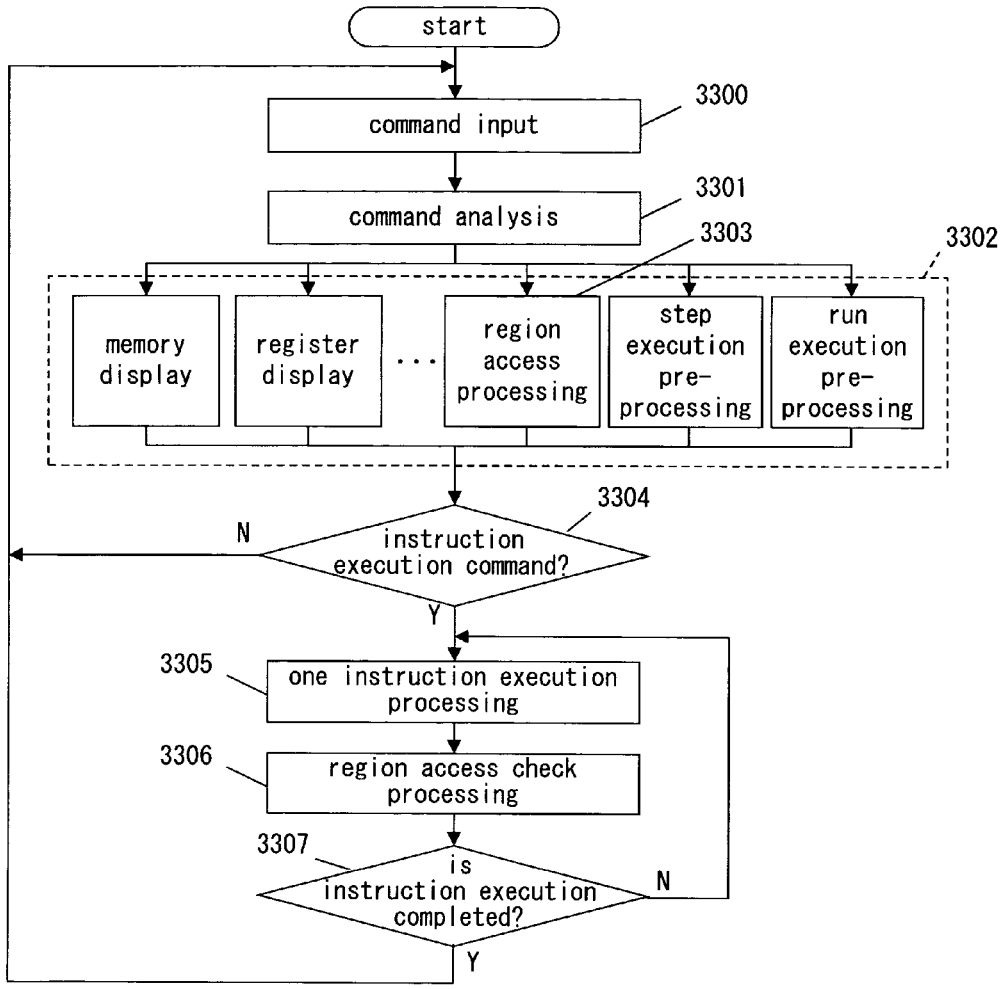
FIG. 33(*a*) is a flowchart illustrating a prior art simulator.
Figure 33B:
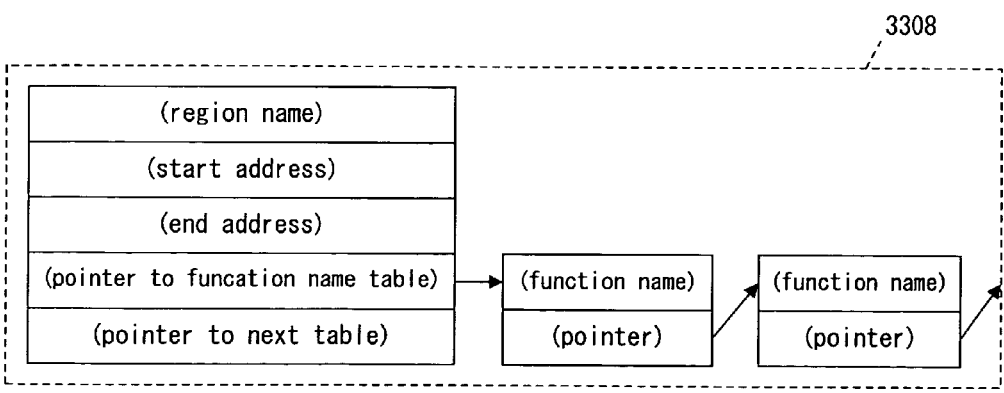

The following discusses the conditioned instructions "JP/CC" with reference to FIG. 32. FIG. 32 illustrates an exemplary conditioned instructions "JP/CC".

In assembler source codes of the conditioned instructions "JP/CC", a format of the conditioned instructions "JP/CC" as well as a function thereof complies with functionality description 3200. The format in the assembler source codes is "JP/CC ADDR". When conditions specified by "CC" are established, executive instructions are branched off to an address specified by "ADDR".

As discussed above, "CC" specifies the conditions that branch off the executive instructions. "ZR0", "NZ0", "ZR1", and "NZ1" may be specified as the conditions. Assuming that "ZR0" is specified, the conditions are established when register "REG0" in the register element 3001 is "0", with the result that the executive instructions are branched off. Assuming that "NZ0" is specified, the conditions are established when register "REG0" is any value other than "0", with the result that the executive instructions are branched off. Assuming that "ZR1" is specified, the conditions are established when register "REG1" in the register element 3001 is "0", with the result that the executive instructions are branched off. Assuming that "NZ1" is specified, the conditions are established when register "REG1" is any value other than "0", with the result that the executive instructions are branched off.

"ADDR" is an address to which the executive instructions are branched off when the conditions specified by "CC" are established. The address "ADDR" is specified in hexadecimal numeral. For example, assume that the executive instructions are branched off to address 0x0005 when register REG0 is "0". In this instance, the format is "JP/ZR0 0x0005".

A relationship between the conditioned instructions "JP/CC" described in the above format, and instruction codes to be loaded into the memory element 3000 is now described with reference to bitmaps 3201, 3202. The bitmap 3201 illustrates instruction codes (32-bits) of the conditioned instructions "JP/CC".

A series of bit31 to bit22 forms "1100100001" (binary number). Such an instruction code is shown to be the "JP/CC" instructions. A series of bit21 to bit16 represents "CC"-codes that specify the conditions. A bitmap 3202 illustrates how the "CC-codes are set.

The bitmap 3202 shows that "ZR0" is specified when the series of bit21 to bit16 forms "000000" (binary number); "NZ0" is specified when the series of bit21 to bit16 forms "000001" (binary number); "ZR1" is specified when the series of bit21 to bit16 forms "000010" (binary number); and "NZ1" is specified when the series of bit21 to bit16 forms "000011" (binary number). A series of bit15 to bit0 is addresses to which the executive instructions are branched off when the conditions specified by "CC" are established.

Referring back to FIG. 31, at step 3101, the conditioned instruction execution state-analyzing unit 3004 determines whether or not the instructions obtained at step 3100 are the conditioned instructions that execute processing in dependant upon the results from the reference to the register in the register element 3001.

More specifically, when the series of bit31 to bit22 in the instruction codes (32-bits) obtained at step 3100 forms "1100100001" (binary number), then the conditioned instruction execution state-analyzing unit 3004 determines that the instructions obtained at step 3100 are the conditioned instructions "JP/CC". At step 3101, when the conditioned instruction execution state-analyzing unit 3004 does not determine that the instructions obtained at step 3100 are the conditioned instructions "JP/CC", then the routine is terminated, but otherwise the routine is advanced to step 3102.

When it is determined at step 3101 that the instructions obtained at step 3100 are the conditioned instructions "JP/CC", then at step 3102, the conditioned instruction execution state-analyzing unit 3004 obtains an executive instruction address in the memory element 3000.

At step 3103, the conditioned instruction execution state-analyzing unit 3004 obtains a register value contained in the register element 3001. In order to determine the conditions, the register value is referenced by the conditioned instructions obtained at step 3100.

More specifically, the conditioned instruction execution state-analyzing unit 3004 references the series of bit21 to bit16 in the instruction codes (32-bits) obtained at step 3100, to obtain data on register REG0 for either "000000" (binary number) or "000001" (binary number), and to obtain data on register REG1 for either "000010" (binary number) or "000011" (binary number).

At step 3104, the conditioned instruction execution state-analyzing unit 3004 stores the executive instruction address obtained at step 3102 and the referenced register value obtained at step 3103 in a manner interrelated with one another.

At step 3105, the conditioned instruction execution state-analyzing unit 3004 notifies software developers of the executive instruction address and referenced register value stored at step 1304.

The notification may be made in any way, but may be e.g., displayed on an output apparatus such as a display (not shown). According to the present embodiment, the executive instruction address and the referenced register value are notified each time when the conditioned instructions are executed. Alternatively, the executive instruction address and the referenced register value may be only stored during the execution of the conditioned instructions, and the output of the stored information using commands is allowed to execute after the end of the program.

As described above, the simulator according to the present embodiment is operable to store the memory address of the conditioned instructions, and the register value referenced to determine the conditions, and to notify the software developers of the stored information, during the execution of the conditioned instructions that execute processing in dependant upon results from the reference to the register. The practice of software development using the simulator according to the present invention makes it feasible to ascertain how the conditioned instructions are executed, and to verify whether or not software is run in all respects in accordance with the intent of the software developers. As a result, the software is operable with improved perfection (more reliably).

The first to fourth embodiments may, of course, be made in combination with each other.

In conclusion, the present invention provides beneficial effects as given below.

With the occurrence of unintended access to the resources due to software problems, the problems can be pinpointed with ease, and software development with improved efficiency is realized.

With the occurrence of access to non-initialized resources due to software problems, the problems can be pinpointed with ease, and the software development with improved efficiency is achievable.

The software developer is able to ascertain how the conditioned instructions are executed, and to verify whether or not the software is operated in all respects in accordance with the intent of the software developer. As a result, software with improved perfection or software operable with improved reliability is available.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A computing device comprising:
   a first processor; and
   a simulator operable to represent elements including a second processor, using a plurality of simulated elements, and to simulate behaviors of said second processor,
   said plurality of simulated elements comprising:
   a memory element representing a memory operable to store executive instructions issued by said second processor and data treated by said second processor;
   a register element representing a register in said second processor; and
   a control element representing a controller operable to access at least one of said memory element and said register element,
   wherein said simulator comprises:
   a command input unit operable to analyze an entered command and to operate said plurality of simulated elements; and
   a unit operable to check up on resource access in which said control element provides access to at least one of said memory element and said register element,
   wherein said first processor is operated by said simulator,
   wherein said second processor is a simulated target element of said simulator, and wherein said unit operable to check up on said resource access comprises:
a resource information storage unit operable to store resource information, said resource information including a memory region range in said memory element, a read/write classification in said memory element, a register classification in said register element, and a read/write classification in said register element; and
a resource access-analyzing unit operable to analyze, with reference to said resource information, whether or not resource information includes a register classification and a read/write classification on said resource access, said resource access-analyzing unit being connected directly to said control element, said memory element, and said register element, thereby providing said unit operable to check up on said resource access with the ability to check up on said resource access in parallel with simulating behaviors of said second processor.

2. A computing device as defined in claim 1, wherein said resource information is specified by said command.

3. A computing device as defined in claim 1, wherein said resource information is provided as data specified by said command.

4. A computing device as defined in claim 1, wherein said resource information storage unit is operable to store address range information on said executive instructions from said second processor, and
wherein said resource access-analyzing unit is operable to analyze, with reference to said address range information on said executive instructions from said second processor, whether or not operated instructions are included in address of said executive instructions.

5. A computing device comprising:
a first processor; and
a simulator operable to represent elements including a second processor, using a plurality of simulated elements, and to simulate behaviors of said second processor,
said plurality of simulated elements comprising:
a memory element representing a memory operable to store executive instructions issued by said second processor and data treated by said second processor;
a register element representing a register in said second processor; and
a control element representing a controller operable to access at least one of said memory element and said register element,
wherein said simulator comprises:
a command input unit operable to analyze an entered command and to operate said plurality of simulated elements; and
a unit operable to check up on data access in which said control element provides access to at least one of said memory element and said register element,
wherein said first processor is operated by said simulator,
wherein said second processor is a simulated target element of said simulator, and
wherein said unit operable to check up on said data access comprises:
a data information storage unit operable to store data information, said data information including a memory region range in said memory element, a read/write classification in said memory element, a register classification in said register element, and a read/write classification in said register element; and
a data access-analyzing unit operable to analyze, with reference to said data information, whether or not resource information includes a register classification and a read/write classification on said data access, said data access-analyzing unit being connected directly to said control element, said memory element, and said register element, thereby providing said unit operable to check up on said data access with the ability to check up on said data access in parallel with simulating behaviors of said second processor.

6. A computing device as defined in claim 5, wherein said data information is specified by said command.

7. A computing device as defined in claim 5, wherein said data information is provided as data specified by said command.

8. A computing device as defined in claim 5, wherein said data information storage unit is operable to store address range information on said executive instructions from said second processor, and
wherein said data access-analyzing unit is operable to analyze, with reference to said address range information on said executive instructions from said second processor, whether or not operated instructions are included in address of said executive instructions.

9. A computing device comprising:
a first processor; and
a simulator operable to represent elements including a second processor, using a plurality of simulated elements, and to simulate behaviors of said second processor,
said plurality of simulated elements comprising:
a memory element representing a memory operable to store executive instructions issued by said second processor and data treated by said second processor;
a register element representing a register in said second processor; and
a control element representing a controller operable to access at least one of said memory element and said register element,
wherein said simulator comprises:
a command input unit operable to analyze an entered command and to operate said plurality of simulated elements; and
a unit operable to check whether or not at least one of said memory element and said register element has been initialized,
wherein said first processor is operated by said simulator, and
wherein said second processor is a simulated target element of said simulator, and
wherein said unit operable to check whether or not at least one of said memory element and said register element has been initialized comprises:
a resource initialization information-containing unit operable to store information that shows whether or not at least one of said memory element and said register element has been initialized; and
a resource initialization-analyzing unit operable to analyze, with reference to said resource initialization information-containing unit, whether or not at least one of said memory element and said register element to be accessed has been initialized when said control element provides access to at least one of said memory element and said register element, said resource initialization-analyzing unit being connected directly to said control element, said memory element, and said register element, thereby providing said unit operable to check whether or not at least one of said memory element and said register element has been initialized with the ability to check whether or not at least one of said memory element and said register element has been initialized in parallel with simulating behaviors of said second processor.

10. A computing device comprising:
a first processor; and
a simulator operable to represent elements including a second processor, using a plurality of simulated elements, and to simulate behaviors of said second processor,
said plurality of simulated elements comprising:
a memory element representing a memory operable to store executive instructions issued by said second processor and data treated by said second processor;
a register element representing a register in said second processor; and
a control element representing a controller operable to access at least one of said memory element and said register element,
wherein said simulator comprises:
a command input unit operable to analyze an entered command and to operate said plurality of simulated elements; and
a unit operable to check how conditioned instructions executed by said control element are executed,
wherein said first processor is operated by said simulator, and
wherein said second processor is a simulated target element of said simulator, and
wherein said unit operable to check how said conditioned instructions executed by said control element are executed comprises:
a conditioned instruction execution state-analyzing unit operable to store address information on said conditioned instructions and a register value when said control element executes said conditioned instructions, said register value being referenced during execution of said conditioned instructions, said conditioned instruction execution state-analyzing unit being connected directly to said control element, said memory element, and said register element, thereby providing said unit operable to check how said conditioned instructions executed by said control element are executed with the ability to check how said conditioned instructions executed by said control element are executed in parallel with simulating behaviors of said second processor.

11. A simulation method operable to represent elements including a processor, using a plurality of simulated elements, and to simulate behaviors of said processor,
said plurality of simulated elements comprising:
a memory element representing a memory operable to store executive instructions issued by said processor and data treated by said processor;
a register element representing a register in said processor; and
a control element representing a controller operable to access at least one of said memory element and said register element, and to execute conditioned instructions in accordance with a register value in said register element,
wherein said simulation method comprises:
analyzing an entered command to operate said plurality of simulated elements; and
storing information on how said conditioned instructions are executed,
wherein said storing information on how said conditioned instructions are executed comprises:

storing, in a conditioned instruction execution state-analyzing unit, address information on said conditioned instructions and a register value when said control element executes said conditioned instructions, said register value being referenced during execution of said conditioned instructions, said conditioned instruction execution state-analyzing unit being connected directly to said control element, said memory element, and said register element, thereby providing the ability to perform said storing information on how said conditioned instructions are executed in parallel with simulating behaviors of said processor.

12. A simulation method operable to represent elements including a processor, using a plurality of simulated elements, and to simulate behaviors of said processor,
said plurality of simulated elements comprising:
a memory element representing a memory operable to store executive instructions issued by said processor and data treated by said processor;
a register element representing a register in said processor; and
a control element representing a controller operable to access at least one of said memory element and said register element,
wherein said simulation method comprises:
analyzing an entered command to operate said plurality of simulated elements; and
checking up on resource access in which said control element provides access to at least one of said memory element and said register element,
wherein said checking up on said resource access comprises:
storing resource information in a resource information storage unit, the resource information including a memory region in said memory element, a read/write classification in said memory element, a register classification in said register element, and a read/write classification in said register element; and
analyzing, by a resource access-analyzing unit, with reference to said resource information, whether or not resource information includes a register classification and a read/write classification on said resource access, said resource access-analyzing unit being connected directly to said control element, said memory element, and said register element, thereby providing the ability to perform said checking up on said resource access in parallel with simulating behaviors of said processor.

13. A simulation method as defined in claim 12, wherein said resource information is specified by said command.

14. A simulation method as defined in claim 13, wherein said storing said resource information comprises storing address range information on said executive instructions from said processor, and
wherein said analyzing, with reference to said resource information, whether or not resource information includes a register classification and a read/write classification on said resource access comprises analyzing, with reference to said address range information on said executive instructions from said processor, whether or not operated instructions are included in address of said executive instructions.

15. A simulation method as defined in claim 12, wherein said resource information is provided as data specified by said command.

16. A simulation method as defined in claim 15, wherein said storing said resource information comprises storing address range information on said executive instructions from said processor, and wherein said analyzing, with reference to said resource information, whether or not resource information includes a register classification and a read/write classification on said resource access comprises analyzing, with reference to said address range information on said executive instructions from said processor, whether or not operated instructions are included in address of said executive instructions.

17. A simulation method as defined in claim 12, wherein said storing said resource information comprises storing address range information on said executive instructions from said processor, and wherein said analyzing, with reference to said resource information, whether or not said resource access is proper comprises analyzing, with reference to said address range information on said executive instructions from said processor, whether or not operated instructions are included in address of said executive instructions.

18. A simulation method operable to represent elements including a processor, using a plurality of simulated elements, and to simulate behaviors of said processor, said plurality of simulated elements comprising:

a memory element representing a memory operable to store executive instructions issued by said processor and data treated by said processor;

a register element representing a register in said processor; and a control element representing a controller operable to access at least one of said memory element and said register element, wherein said simulation method comprises:

analyzing an entered command to operate said plurality of simulated elements; and checking up on data access in which said control element provides access to at least one of said memory element and said register element, wherein said checking up on said data access comprises:

storing data information in a data information storage unit, said data information including a memory region range in said memory element, a read/write classification in said memory element, a register classification in said register element, and a read/write classification in said register element; and analyzing, by a data access-analyzing unit, with reference to said data information, whether or not resource information includes a register classification and a read/write classification on said data access, said data access-analyzing unit being connected directly to said control element, said memory element, and said register element, thereby providing the ability to perform said checking up on said data access in parallel with simulating behaviors of said processor.

19. A simulation method as defined in claim 18, wherein said data information is specified by said command.

20. A simulation method as defined in claim 18, wherein said data information is provided as data specified by said command.

21. A simulation method as defined in claim 18, wherein said storing said data information comprises storing address range information on said executive instructions from said processor, and wherein said analyzing, with reference to said data information, whether or not said data access is proper comprises analyzing, with reference to said address range information on said executive instructions from said processor, whether or not said executive instructions are proper.

22. A simulation method operable to represent elements including a processor, using a plurality of simulated elements, and to simulate behaviors of said processor, said plurality of simulated elements comprising:

a memory element representing a memory operable to store executive instructions issued by said processor and data treated by said processor;

a register element representing a register in said processor; and a control element representing a controller operable to access at least one of said memory element and said register element, wherein said simulation method comprises:

analyzing an entered command to operate said plurality of simulated elements; and checking whether or not at least one of said memory element and said register element has been initialized, wherein said checking whether or not at least one of said memory element and said register element has been initialized comprises:

storing, in a resource initialization information-containing unit, information that shows whether or not at least one of said memory element and said register element has been initialized; and analyzing, by a resource initialization-analyzing unit, with reference to said resource information-containing unit, whether or not at least one of said memory element and said register element to be accessed has been initialized when said control element provides access to either at least one of said memory element and said register element, said resource initialization-analyzing unit being connected directly to said control element, said memory element, and said register element, thereby providing the ability to perform said checking whether or not at least one of said memory element and said register element has been initialized in parallel with simulating behaviors of said processor.

* * * * *